(12) United States Patent
Hasegawa et al.

(10) Patent No.: US 8,704,564 B2
(45) Date of Patent: Apr. 22, 2014

(54) PLL CIRCUIT

(71) Applicant: Fujitsu Semiconductor Limited, Kanagawa (JP)

(72) Inventors: Kazuki Hasegawa, Niiza (JP); Shunichiro Masaki, Akiruno (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/780,936

(22) Filed: Feb. 28, 2013

(65) Prior Publication Data

US 2013/0271191 A1 Oct. 17, 2013

(30) Foreign Application Priority Data

Apr. 16, 2012 (JP) ................... 2012-092863

(51) Int. Cl.
*H03L 7/06* (2006.01)
(52) U.S. Cl.
USPC .......................................... 327/156; 327/147
(58) Field of Classification Search
USPC .................................. 327/147, 156
See application file for complete search history.

(56) References Cited

U.S. PATENT DOCUMENTS

| 7,019,571 B2 * | 3/2006 | Lim ............................... 327/157 |
| 7,078,946 B2 * | 7/2006 | van der Valk et al. ........ 327/156 |
| 7,564,281 B2 * | 7/2009 | Luo et al. ...................... 327/156 |
| 8,278,984 B2 * | 10/2012 | Lamanna et al. ............. 327/156 |
| 2005/0248395 A1 * | 11/2005 | Zhu et al. ...................... 327/554 |
| 2005/0248413 A1 * | 11/2005 | Zhu et al. ......................... 331/17 |
| 2008/0084242 A1 * | 4/2008 | Ullmann ........................ 327/554 |
| 2008/0174349 A1 * | 7/2008 | Luo et al. ...................... 327/157 |
| 2009/0237036 A1 | 9/2009 | Ikeda et al. |
| 2010/0073049 A1 * | 3/2010 | Tsai et al. ...................... 327/157 |
| 2011/0012652 A1 * | 1/2011 | Lamanna et al. ............. 327/156 |
| 2011/0025386 A1 * | 2/2011 | Lamanna et al. ............. 327/156 |
| 2011/0215848 A1 * | 9/2011 | Koroglu et al. ............... 327/157 |
| 2012/0256665 A1 * | 10/2012 | Teng ............................. 327/156 |
| 2012/0280729 A1 * | 11/2012 | August et al. ................. 327/156 |

FOREIGN PATENT DOCUMENTS

| JP | 11-308105 A | 11/1999 |
| JP | 2008-035451 A | 2/2008 |

* cited by examiner

*Primary Examiner* — Adam Houston
(74) *Attorney, Agent, or Firm* — Arent Fox LLP

(57) ABSTRACT

A PLL circuit includes a low-pass filter configured to generate a control voltage according to an output current from a charge pump. The low-pass filter includes a preceding stage circuit portion configured to store electric charges according to the output current from the charge pump, and a succeeding stage circuit portion configured to generate the control voltage by receiving the electric charges stored in and transferred from the preceding stage circuit portion. Also, the preceding stage circuit portion includes plural charge storage circuits each including a capacitor, a first switch connected between the capacitor and the charge pump and configured to be driven by a first switch control signal, and a second switch connected between the capacitor and the succeeding stage circuit portion and configured to be driven by a second switch control signal.

13 Claims, 29 Drawing Sheets

PLL CIRCUIT

CROSS-REFERENCE TO RELATED APPLICATION

This application is based upon and claims the benefit of priority of the prior Japanese Patent Application No. 2012-92863, filed on Apr. 16, 2012, the entire contents of which are incorporated herein by reference.

FIELD

The embodiments discussed herein are related to a PLL circuit.

BACKGROUND

A PLL (Phase Locked Loop) circuit is used for example as a frequency synthesizer for generating a sampling clock for an AD (analog-to-digital) converter, and is mounted on almost every semiconductor device called SOC (System on Chip). A PLL circuit for generating a clock having a small amount of phase jitter is used in order for the AD converter to perform AD conversion with high accuracy.

Generally, the PLL circuit includes a voltage controlled oscillator (hereinafter referred to as "VCO"), a charge pump (CP), and a phase frequency detector (PFD). This type of PLL circuit involves three main factors which affect jitter which are phase noise of the VCO, power supply noise and reference spurious (sometimes called reference leak).

Among these factors, the phase noise of the VCO may be reduced by increasing power consumption by the VCO, for example. Also, the power supply noise may be reduced by power supply disconnection, a bypass capacitor, or the like.

However, a further reduction in the jitter involves the problem of the reference spurious.

A main cause of occurrence of the reference spurious is that a charge pump current flows in order to compensate for variations in a control voltage of the VCO caused by leak or the like, and thereby temporary variations in the control voltage occur. When the PLL circuit is locked (or phase-locked), the control voltage repeats the following variations at every comparison cycle; specifically, the control voltage varies greatly at the instant of phase comparison and then varies gradually.

Heretofore, a low-pass filter (LPF) of the PLL circuit has been devised in order to reduce the jitter caused by the reference spurious. For example, there have been proposals of a method which involves sampling a voltage of a low-pass filter by a switched capacitor filter, and supplying the sampled voltage to a VCO, and a method which involves performing pipeline processing for charging or discharging operations for plural capacitances connected in parallel.

[Patent Document 1] Japanese Laid-open Patent Publication No. 11-308105
[Patent Document 2] Japanese Laid-open Patent Publication No. 2008-35451

SUMMARY

According to one aspect of the disclosed technology, there is provided a PLL circuit including: a voltage controlled oscillator configured to output a signal of frequency according to a control voltage; a frequency divider configured to perform frequency division on the output signal from the voltage controlled oscillator; a phase frequency detector configured to compare phases of an input clock and an output signal from the frequency divider; a charge pump configured to output a current according to an output signal from the phase frequency detector; and a low-pass filter configured to generate the control voltage according to the output current from the charge pump, in which the low-pass filter includes a preceding stage circuit portion configured to store electric charges according to the output current from the charge pump, and a succeeding stage circuit portion configured to generate the control voltage by receiving the electric charges stored in and transferred from the preceding stage circuit portion, and the preceding stage circuit portion includes plural charge storage circuits each including a capacitor, a first switch connected between the capacitor and the charge pump and configured to be driven by a first switch control signal, and a second switch connected between the capacitor and the succeeding stage circuit portion and configured to be driven by a second switch control signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to description of embodiments, description will be given below with regard to a prelude to simplify an understanding of the embodiments.

Figure 1:
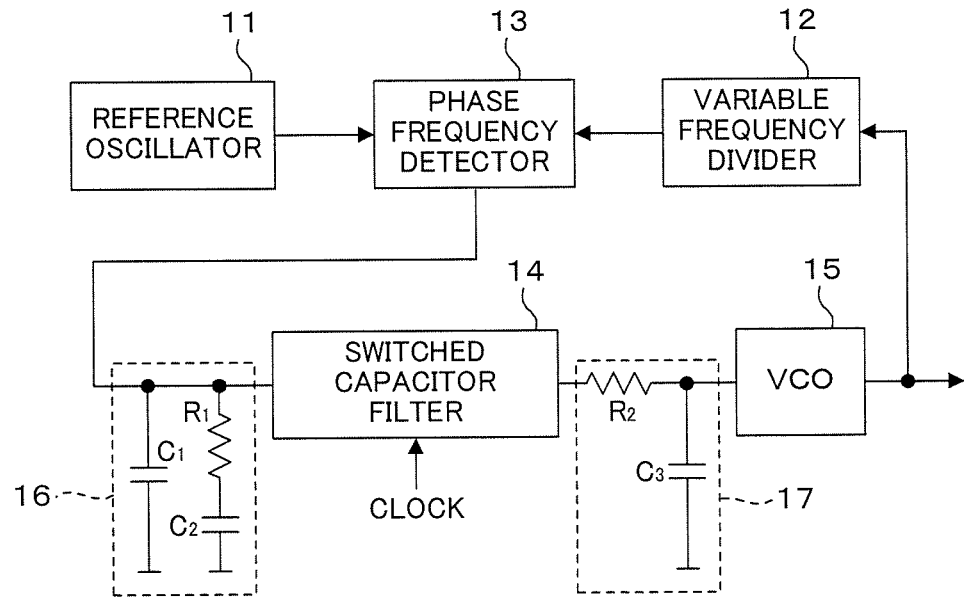
FIG. 1 is a diagram illustrating an example of a PLL circuit in which a switched capacitor is used to reduce reference spurious.

FIG. 1 is a diagram illustrating an example of a PLL circuit in which a switched capacitor is used to reduce reference spurious. The PLL circuit illustrated by example in FIG. 1 includes a reference oscillator 11, a variable frequency divider 12, a phase frequency detector 13, a switched capacitor filter 14, a VCO 15, a loop filter 16, and a low-pass filter 17. The loop filter 16 includes a capacitor C1, a resistor R1 and a capacitor C2, and the low-pass filter 17 includes a resistor R2 and a capacitor C3.

In the PLL circuit, an output from the VCO 15 is subjected to frequency division by the variable frequency divider 12, which then inputs a result to the phase frequency detector 13. The phase frequency detector 13 compares an output (or clock) from the reference oscillator 11 and an output from the variable frequency divider 12, and outputs a signal according to a compared result. The loop filter 16 generates a voltage according to the output signal from the phase frequency detector 13.

The switched capacitor filter 14 samples the output voltage from the loop filter 16 at time points in synchronization with the sampling clock outputted from the reference oscillator 11, and provides an output signal to the low-pass filter 17. The low-pass filter 17 eliminates high frequency components from the output signal from the switched capacitor filter 14 thereby to form a control voltage, which is then supplied to the VCO 15. The VCO 15 outputs a signal of frequency according to the control voltage supplied from the low-pass filter 17.

In the above-described PLL circuit, the switched capacitor filter 14 is used as a notch filter to reduce reference spurious. In the PLL circuit, however, the output voltage from the loop filter 16 varies at the time point of phase comparison by the phase frequency detector 13. When the switched capacitor filter 14 samples the output voltage from the loop filter 16 at that time point, reference spurious of the frequency of the reference oscillator 11 disadvantageously remains in the output signal (or clock) from the VCO 15.

Figure 2:
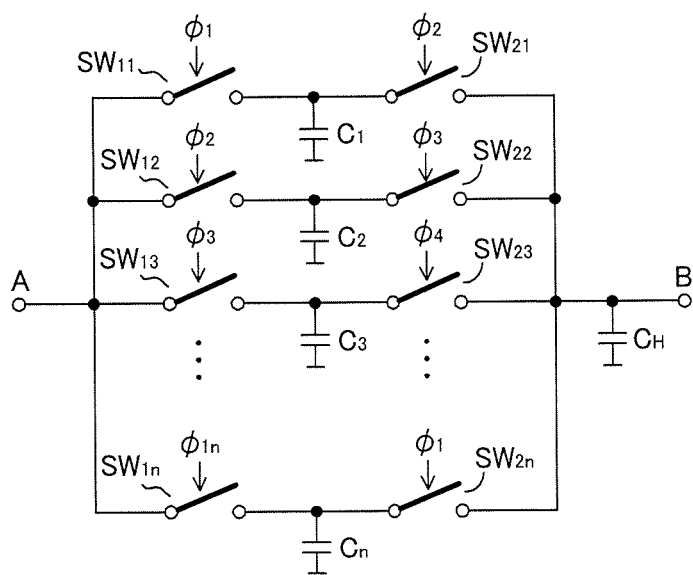
FIG. 2 is a circuit diagram illustrating an example of a loop filter used in the PLL circuit.
Figure 3:
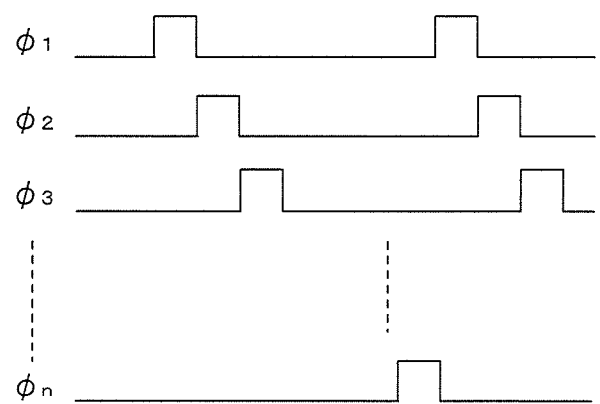
FIG. 3 is a timing chart illustrating signals $\phi 1$ to $\phi n$ to drive switches in the loop filter of FIG. 2.

FIG. 2 is a circuit diagram illustrating an example of the loop filter used in the PLL circuit, and FIG. 3 is a timing chart illustrating signals $\phi 1$ to $\phi n$ to drive switches in the loop filter.

The loop filter illustrated in FIG. 2 includes capacitors C1 to Cn, and switches $SW_{11}, SW_{12}, \ldots, SW_{1n}$ and switches $SW_{21}, SW_{22}, \ldots, SW_{2n}$ which perform pipeline processing for charging or discharging operation for the capacitors C1 to Cn. An input terminal A is connected to a charge pump, and an output terminal B is connected to the VCO. A capacitor $C_H$ is connected between the output terminal B and ground.

In the loop filter, electric charges charged sequentially into the capacitors C1 to Cn are sequentially transferred to the capacitor $C_H$ to increase the value of an apparent time constant and thereby reduce the amount of variations in the control voltage of the VCO, for purposes of reference spurious suppression.

However, when the PLL circuit is in a locked state, a charge pump current flows in an instant, and one or two capacitors may take in the charge pump current even if many capacitors are provided as illustrated in FIG. 2. Therefore, there is little expectation that the effect of suppressing reference spurious will be achieved.

With reference to the following embodiments, description will be given with regard to a PLL circuit capable of achieving a further reduction in reference spurious as compared to hitherto.

First Embodiment

Figure 4:
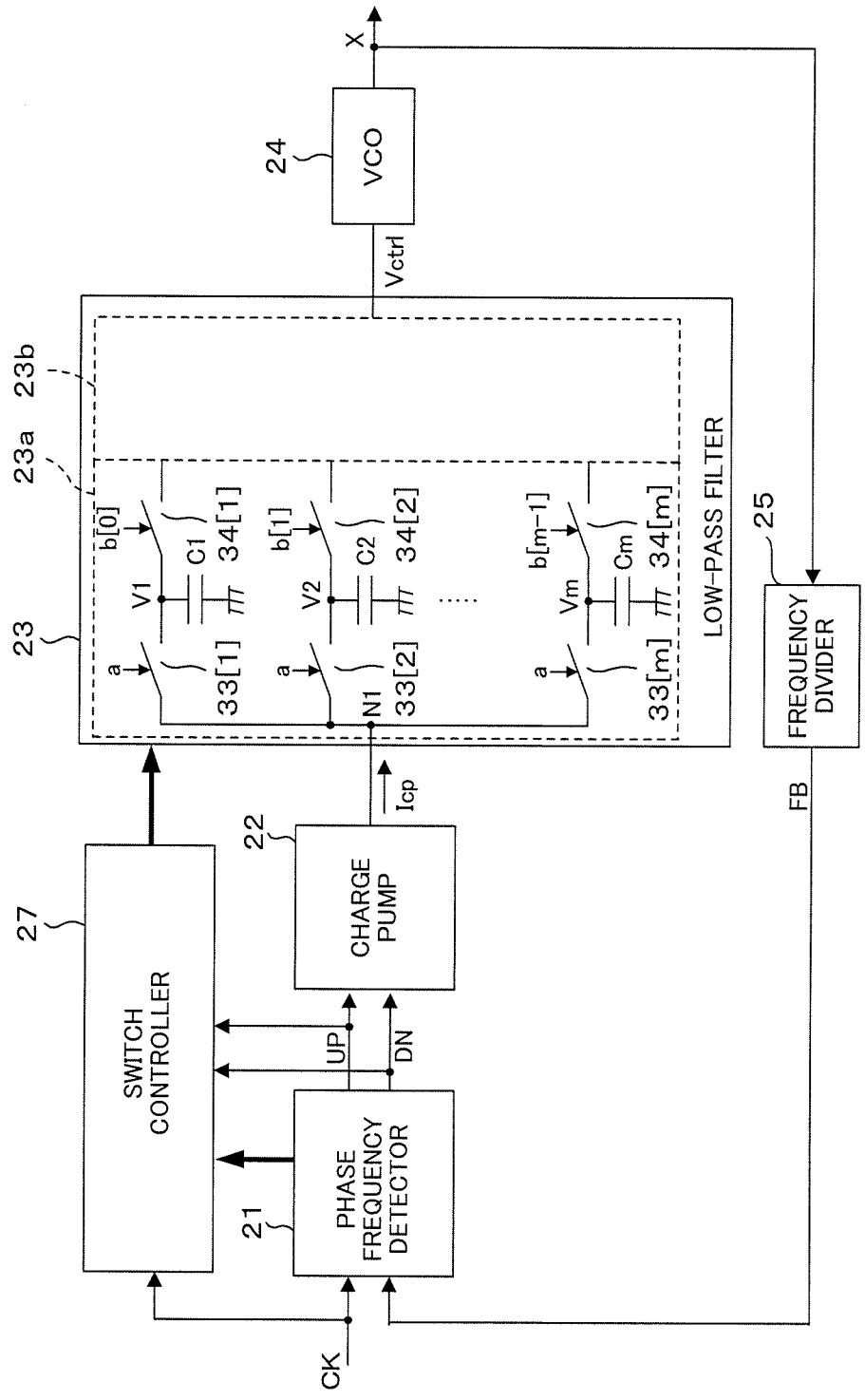
FIG. 4 is a block diagram of a PLL circuit according to a first embodiment.
Figure 5:
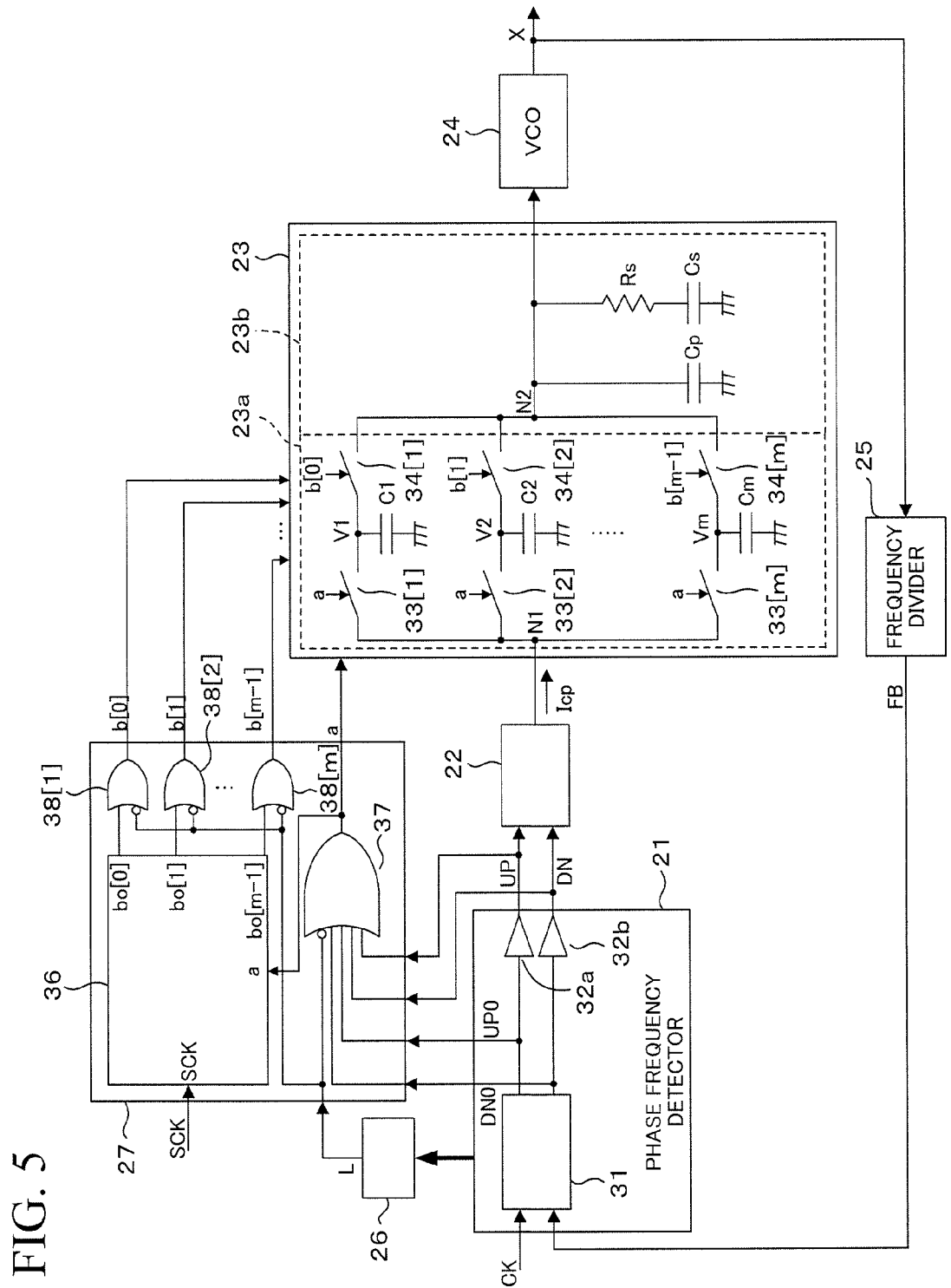
FIG. 5 is a circuit diagram illustrating the PLL circuit according to the first embodiment.

FIG. 4 is a block diagram of a PLL circuit according to a first embodiment, and FIG. 5 is a circuit diagram illustrating details of the PLL circuit.

The PLL circuit according to the first embodiment includes a phase frequency detector 21, a charge pump 22, a low-pass filter 23, a VCO 24, a frequency divider 25, a lock detector 26, and a switch controller 27.

The phase frequency detector 21 includes a phase comparator 31 and buffers 32a, 32b, and receives input of an input clock CK and a feedback clock FB and outputs an Up signal UP and a Down signal DN. The phase comparator 31 compares the phases of the input clock CK and the feedback clock FB and outputs an Up signal UP0 and a Down signal DN0 according to compared results. The buffer 32a receives input of the Up signal UP0 and outputs the Up signal UP, and the buffer 32b receives input of the Down signal DN0 and outputs the Down signal DN.

The charge pump 22 receives input of the Up signal UP and the Down signal DN from the phase frequency detector 21 and outputs a charge pump current Icp to the low-pass filter 23.

The low-pass filter 23 includes a preceding stage circuit portion 23a and a succeeding stage circuit portion 23b, and outputs a control voltage Vctrl according to the charge pump current Icp. A node N1 in the low-pass filter 23 is the node connected to the charge pump 22, and a node N2 therein is the node connected to the VCO 24.

The preceding stage circuit portion 23a includes m charge storage circuits connected in parallel between the node N1 and the node N2. Each of the charge storage circuits includes two switches 33[n], 34[n] (where n is any integer between 1 and m) connected in series between the node N1 and the node N2, and a capacitor Cn connected between a node Vn between the switches 33[n], 34[n] and ground. In the first embodiment, the capacitance values of the capacitors C1 to Cm are all set equal.

The switch 33[n] is turned on or off by a switch control signal a outputted from the switch controller 27, and the switch 34[n] is turned on or off by a switch control signal b[n−1] outputted from the switch controller 27. The switches 33[1] to 33[m] are each an example of a first switch, and the switches 34[1] to 34[m] are each an example of a second switch.

The succeeding stage circuit portion 23b is formed for example of a capacitor Cp connected between the node N2 and the ground, and a resistor Rs and a capacitor Cs connected in series between the node N2 and the ground, and the control voltage Vctrl is generated by electric charges stored in the capacitors Cp, Cs.

The VCO 24 outputs a clock X of frequency according to the control voltage Vctrl outputted from the low-pass filter 23. Also, the frequency divider 25 performs frequency division on the clock X to form a signal, which is then outputted as the feedback clock FB. As previously mentioned, the feedback clock FB is inputted to the phase frequency detector 21.

The lock detector 26 determines whether or not the PLL circuit is in a locked state, from a signal fed from the phase frequency detector 21, and outputs a lock detection signal L which makes a transition from one state to another according to determined results. In the first embodiment, when a decision is made that the PLL circuit is in the locked state, the lock detection signal L becomes "HIGH," whereas when a decision is made that the PLL circuit is not in the locked state, the lock detection signal L becomes "LOW."

The switch controller 27 includes a switch control signal generator 36, an OR circuit 37 with five inputs, and m OR circuits 38[1] to 38[m] each with two inputs. The OR circuit 37 with five inputs receives input of an inverted signal of the lock detection signal L, and the Up signal UP0, the Down signal DN0, the Up signal UP and the Down signal DN outputted from the phase frequency detector 21, and outputs the switch control signal a. As previously mentioned, the switch control signal a is the signal to turn on or off the switches 33[1] to 33[m] in the low-pass filter 23. The switch control signal a is an example of a first switch control signal.

Figure 6:
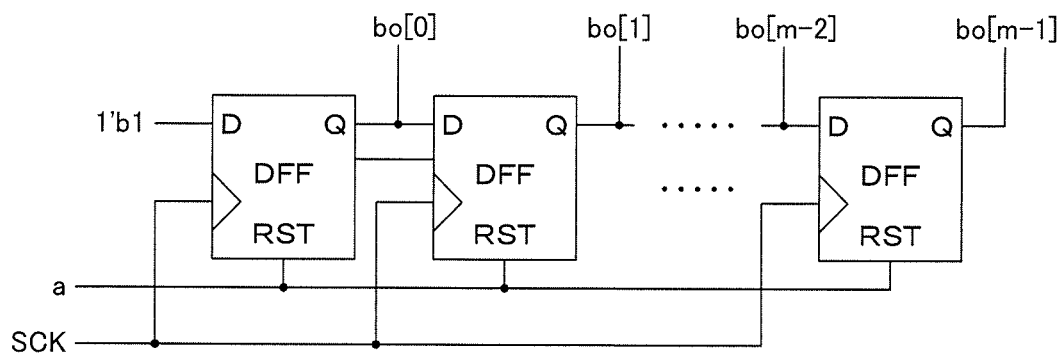
FIG. 6 is a diagram illustrating a structure of a switch control signal generator.

As illustrated for example in FIG. 6, the switch control signal generator 36 includes an m-stage shift register which receives input of a switch control clock SCK and is reset by the switch control signal a. In FIG. 6, the shift register is illustrated by example as being formed of m D-type flip-flops. Incidentally, in FIG. 6, 1'b1 indicates a signal in its "HIGH" state.

The switch control signal generator 36 outputs switch control signals bo[0] to bo[m−1]. The OR circuit 38[n] with two inputs (where n is any integer between 1 and m) receives input of the switch control signal bo[n−1] and an inverted signal of the lock detection signal L, and outputs the switch control signal b[n−1]. The switch control signal b[n−1] is an example of a second switch control signal.

Figure 7:
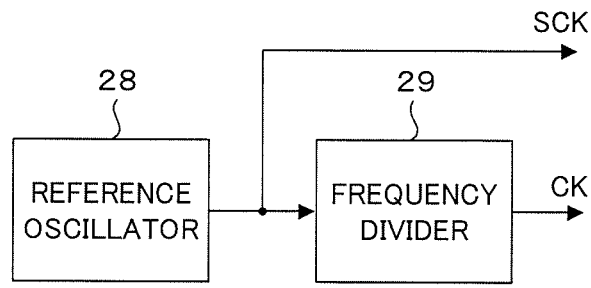
FIG. 7 is a diagram illustrating a relationship between a switch control clock SCK and an input clock CK.

FIG. 7 is a diagram illustrating a relationship between the switch control clock SCK and the input clock CK. In the first embodiment, as illustrated in FIG. 7, a reference clock outputted from a reference oscillator 28 is used as the switch control clock SCK, and a signal obtained by a frequency divider 29 performing frequency division on the switch control clock SCK is used as the input clock CK.

Figure 8:
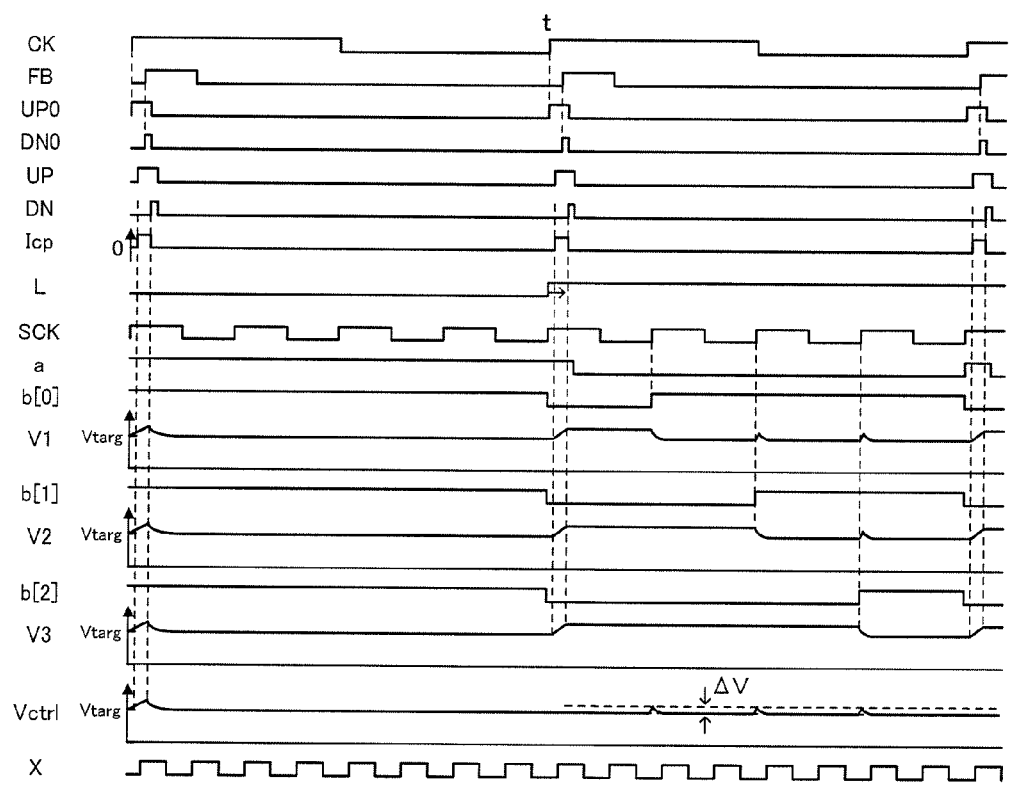
FIG. 8 is a timing chart illustrating operation of the PLL circuit according to the first embodiment.

FIG. 8 is a timing chart illustrating operation of the PLL circuit according to the first embodiment. It is to be noted here that a frequency division factor K of the frequency divider 29 is set equal to 4 (K=4), the number m of charge storage circuits is set equal to 3 (m=3), and a frequency division factor (or a frequency multiplication factor) N of the frequency divider 25 is set equal to 8 (N=8).

When the PLL circuit is not in the locked state, the lock detection signal L outputted from the lock detector 26 is "LOW." Thus, the switch control signal a outputted from the OR circuit 37 with five inputs becomes "HIGH," and the switch control signals b[0] to b[2] also become "HIGH."

Thereby, the switches 33[1] to 33[3] and the switches 34[1] to 34[3] in the low-pass filter 23 are all turned on, and the charge pump current Icp is inputted to the succeeding stage circuit portion 23b of the low-pass filter 23 through the switches 33[1] to 33[3] and the switches 34[1] to 34[3]. Then, electric charges according to the charge pump current Icp are stored in the capacitors Cp, Cs of the succeeding stage circuit portion 23b, and a voltage according to the electric charges is fed as the control voltage Vctrl to the VCO 24. The phase frequency detector 21 adjusts the charge pump current Icp so as to ensure a small phase difference between the input clock CK and the feedback clock FB.

In an example given in FIG. 8, the PLL circuit is locked (or phase-locked) at time point t. When the PLL circuit becomes locked, the lock detection signal L becomes "HIGH," and the switch control signal a and the switch control signals b[0] to b[2] outputted from the switch controller 27 change in synchronization with the input clock CK. Specifically, when the charge pump current Icp flows, the switch control signal a is "HIGH," and thus, the switches 33[1] to 33[3] are turned on, while the switches 34[1] to 34[3] are turned off. Thereby, the charge pump current Icp flows into the capacitors C1 to C3, and electric charges according to the charge pump current Icp are stored in the capacitors C1 to C3.

After that, the switch control signal a becomes "LOW," and the switches 33[1] to 33[3] are all turned off. Then, the switch control signals b[0], b[1], b[2] sequentially become "HIGH" in synchronization with the switch control clock SCK, the switches 34[1] to 34[3] are sequentially turned on, and the electric charges are sequentially transferred from the capacitors C1, C2, C3 to the succeeding stage circuit portion 23b.

In short, in the first embodiment, when the PLL circuit becomes locked, electric charges produced by the charge pump current Icp are divided into three portions, which are then transmitted one after another to the succeeding stage circuit portion 23b of the low-pass filter 23, thereby achieving gradual variations in the control voltage Vctrl (represented by ΔV in FIG. 8). This may enable reductions in reference spurious caused by the variations in the control voltage Vctrl and jitter caused by the reference spurious.

(Modification 1)

Figure 9:
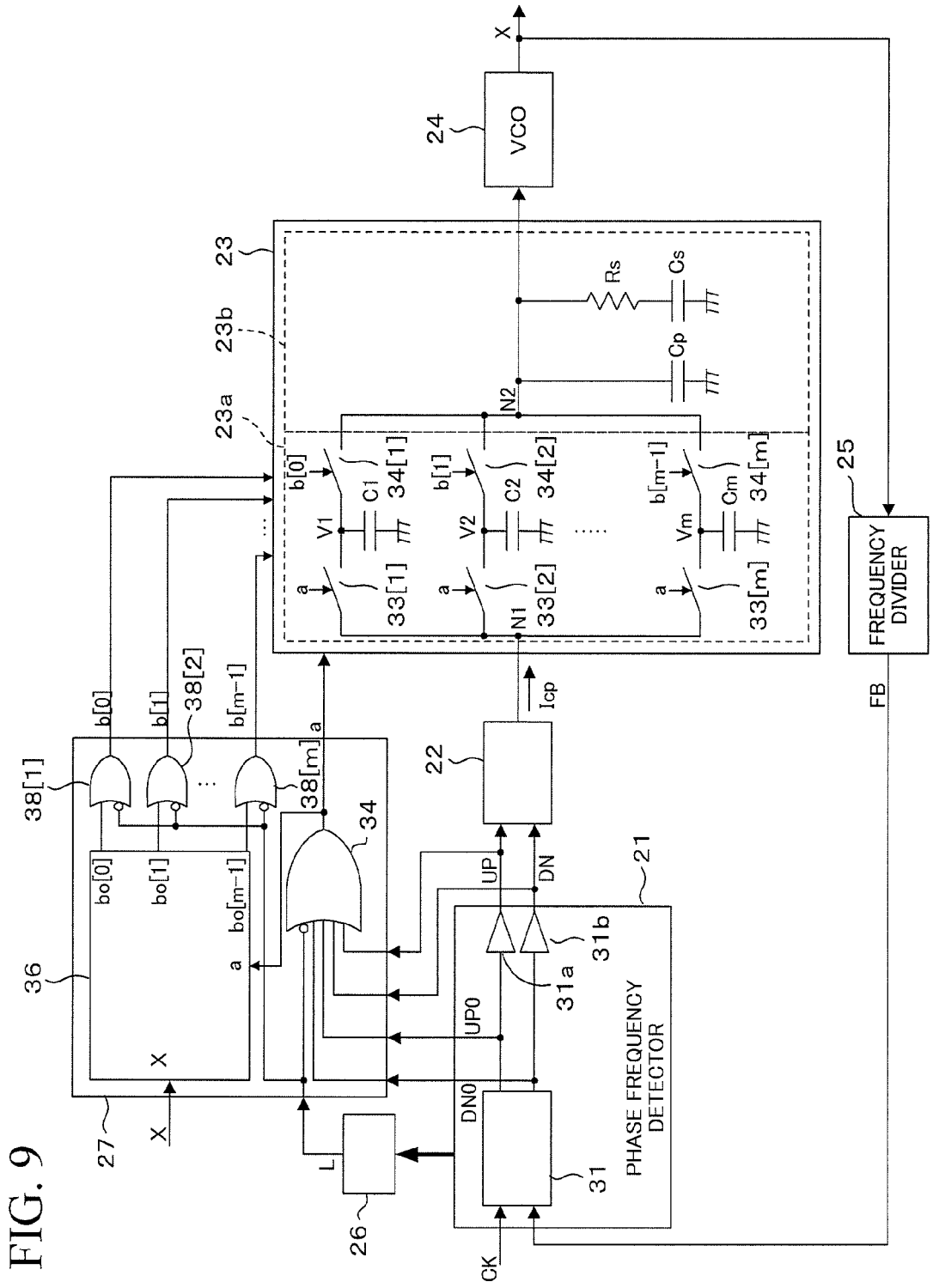
FIG. 9 is a circuit diagram illustrating a PLL circuit according to Modification 1 of the first embodiment.

FIG. 9 is a circuit diagram illustrating a PLL circuit according to Modification 1 of the first embodiment. In FIG. 9, the same parts as those in FIG. 5 are designated by the same reference characters, and detailed description of the same parts will be omitted.

In the first embodiment, as illustrated in FIG. 7, the reference clock fed from the reference oscillator 28 is used as the switch control clock SCK, and the signal obtained by the frequency divider 29 performing frequency division on the reference clock is used as the input clock CK. In this case, the heightening of the frequency of the input clock CK may require a reference oscillator to generate a reference clock of higher frequency than that of the input clock CK.

In Modification 1, therefore, as illustrated in FIG. 9, the clock X outputted from the VCO 24 is fed as a switch control signal to the switch controller 27. In FIG. 9, the same parts as those in FIG. 5 are designated by the same reference characters.

Figure 10:
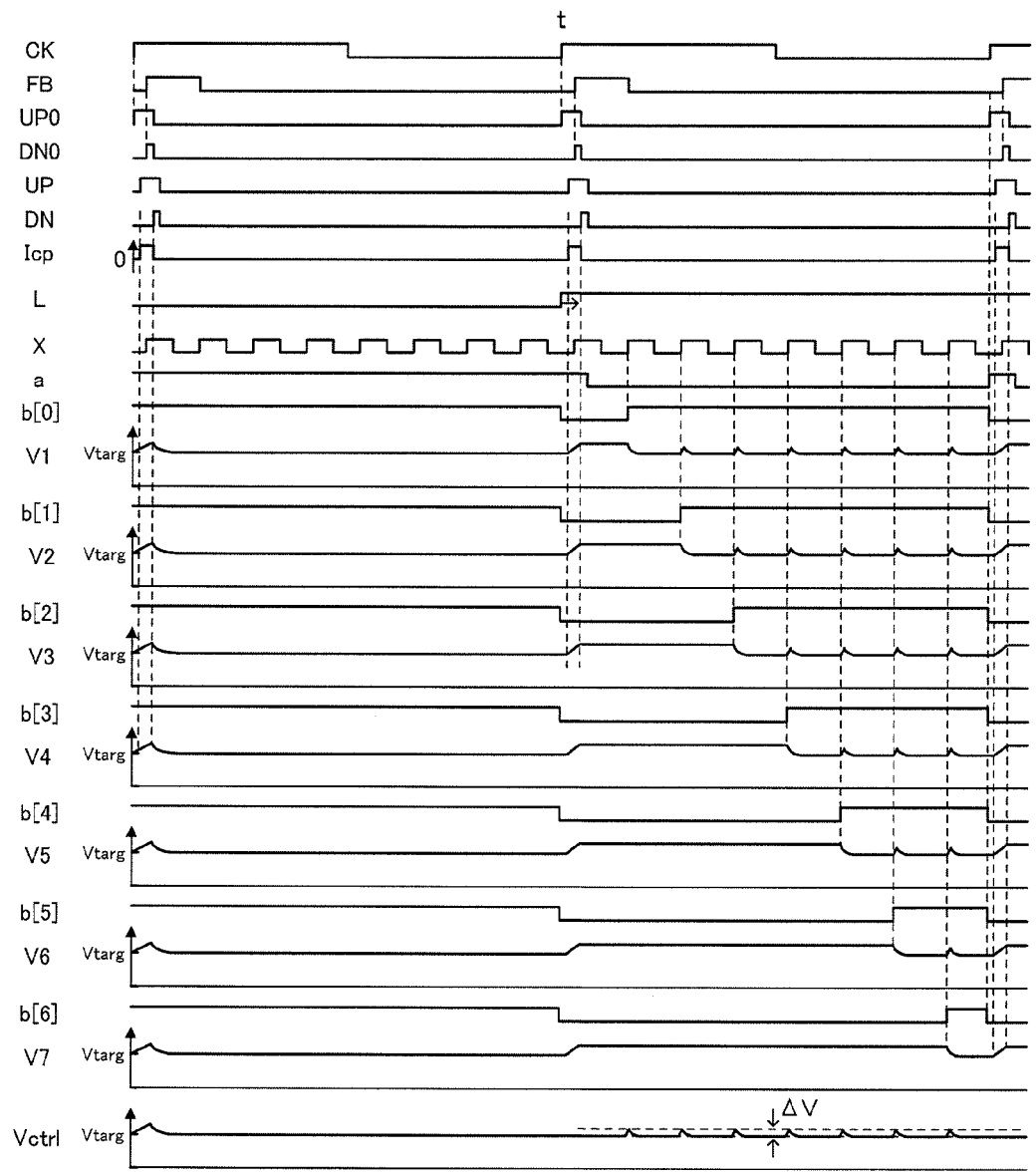
FIG. 10 is a timing chart illustrating operation of the PLL circuit according to Modification 1.

FIG. 10 is a timing chart illustrating operation of the PLL circuit according to Modification 1. Here, the number m of charge storage circuits is set smaller by 1 than the frequency division factor N of the frequency divider 25, taking into account the time point when the charge pump current Icp flows.

Specifically, the number m of charge storage circuits is set equal to 7 (m=7), and the frequency division factor (or the frequency multiplication factor) N of the frequency divider 25 is set equal to 8 (N=8).

In Modification 1, eight periods of the output clock X elapse during a period of the input clock CK; during seven of the eight periods, electric charges stored in the capacitors C1 to C7 are sequentially transmitted to the succeeding stage circuit portion 23b. Thereby, the control voltage Vctrl varies gradually, thus maybe enabling reductions in reference spurious caused by variations in the control voltage Vctrl (represented by ΔV in FIG. 10) and jitter caused by the reference spurious.

(Modification 2)

Figure 11:
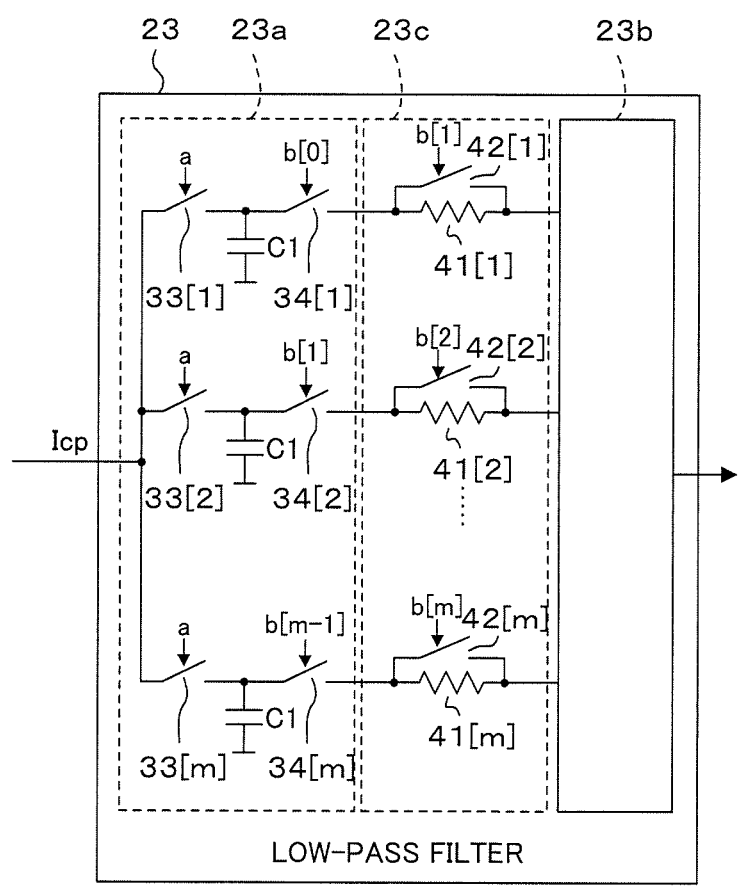
FIG. 11 is a circuit diagram illustrating a low-pass filter of a PLL circuit according to Modification 2.

FIG. 11 is a circuit diagram illustrating a low-pass filter of a PLL circuit according to Modification 2. Incidentally, Modification 2 is different from the first embodiment in respect of structure of the low-pass filter and other structures are basically the same as those of the first embodiment, and therefore, description of overlaps will be omitted here.

In Modification 2, a time constant adjustment unit 23c is provided between the preceding stage circuit portion 23a and the succeeding stage circuit portion 23b of the low-pass filter 23. The time constant adjustment unit 23c includes m time constant adjustment circuits, and each of the time constant adjustment circuits includes a resistor 41[n] (where n is any integer between 1 and m), and a switch 42[n] connected in parallel with the resistor 41[n]. The switch 42[n] is an example of a third switch.

In the first embodiment, the switch controller 27 generates the switch control signals b[0] to b[m−1], whereas in Modification 2, the switch controller 27 generates the switch control signals b[0] to b[m]. In the first embodiment, the switch control signal generator 36 includes the m-stage shift register, whereas in Modification 2, the switch control signal generator 36 includes an (m+1)-stage shift register, and generates switch control signals bo1[0] to bo1[m].

The switch 42[n] is turned on or off by a switch control signal b1[n] outputted from the switch controller 27. Specifically, when the switch 34[n] is turned on by the switch control signal b[n−1], electric charges stored in the capacitor Cn are transmitted via the resistor 41[n] to the succeeding stage circuit portion 23b. After that, the switch 42[n] is turned on by the switch control signal b[n], and the potential of the node N2 becomes equal to the potential of the node Vn.

In Modification 2, as described above, the electric charges stored in the capacitor Cn are transmitted via the resistor 41[n] to the succeeding stage circuit portion 23b, thus suppressing a rapid transfer of the electric charges to the succeeding stage circuit portion 23b. Thereby, the control voltage Vctrl varies more gradually, thus maybe enabling a further reduction in reference spurious.

(Modification 3)

Figure 12:
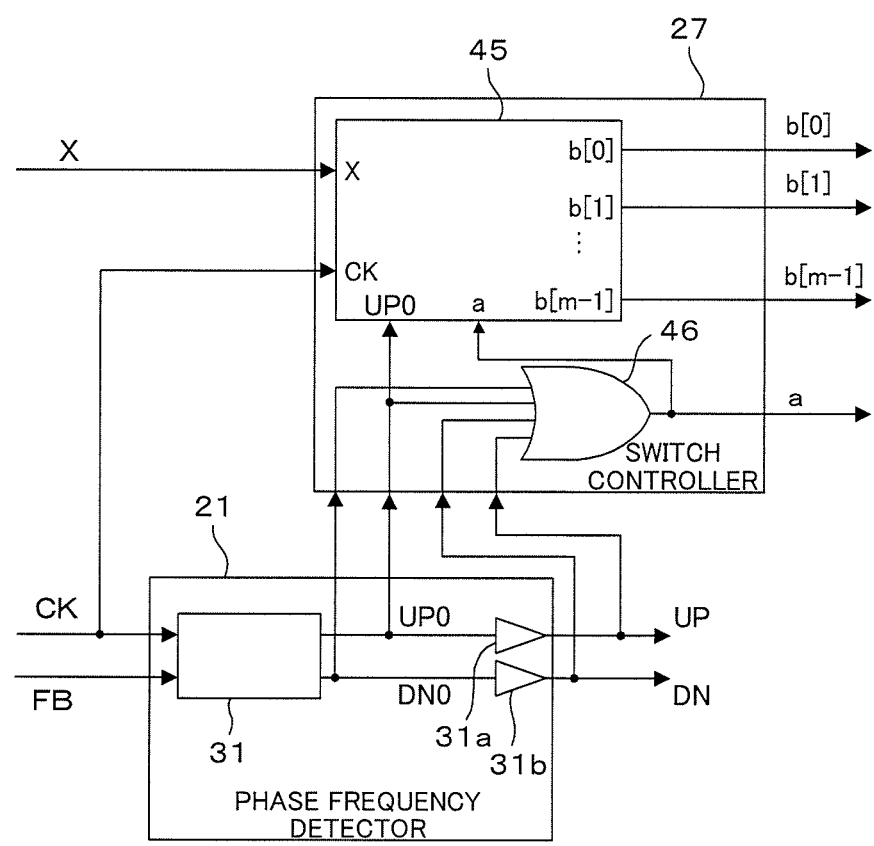
FIG. 12 is a circuit diagram illustrating a phase frequency detector and a switch controller of a PLL circuit according to Modification 3.

FIG. 12 is a circuit diagram illustrating a phase frequency detector and a switch controller of a PLL circuit according to Modification 3. Modification 3 is different from the first embodiment in respect of structure of the switch controller and other structures are basically the same as those of the first embodiment, and therefore, description of overlaps will be omitted here.

The switch controller 27 includes a switch control signal generator 45, and an OR circuit 46 with four inputs. The OR circuit 46 with four inputs receives input of the Up signal UP0, the Down signal DN0, the Up signal UP and the Down signal DN outputted from the phase frequency detector 21, and outputs the switch control signal a to turn on or off the switches 33[1] to 33[m] in the low-pass filter 23.

The switch control signal generator 45 receives input of the clock X outputted from the VCO 24, and the input clock CK, the Up signal UP0 and the switch control signal a, and outputs the switch control signals b[0] to b[m−1].

Figure 13:
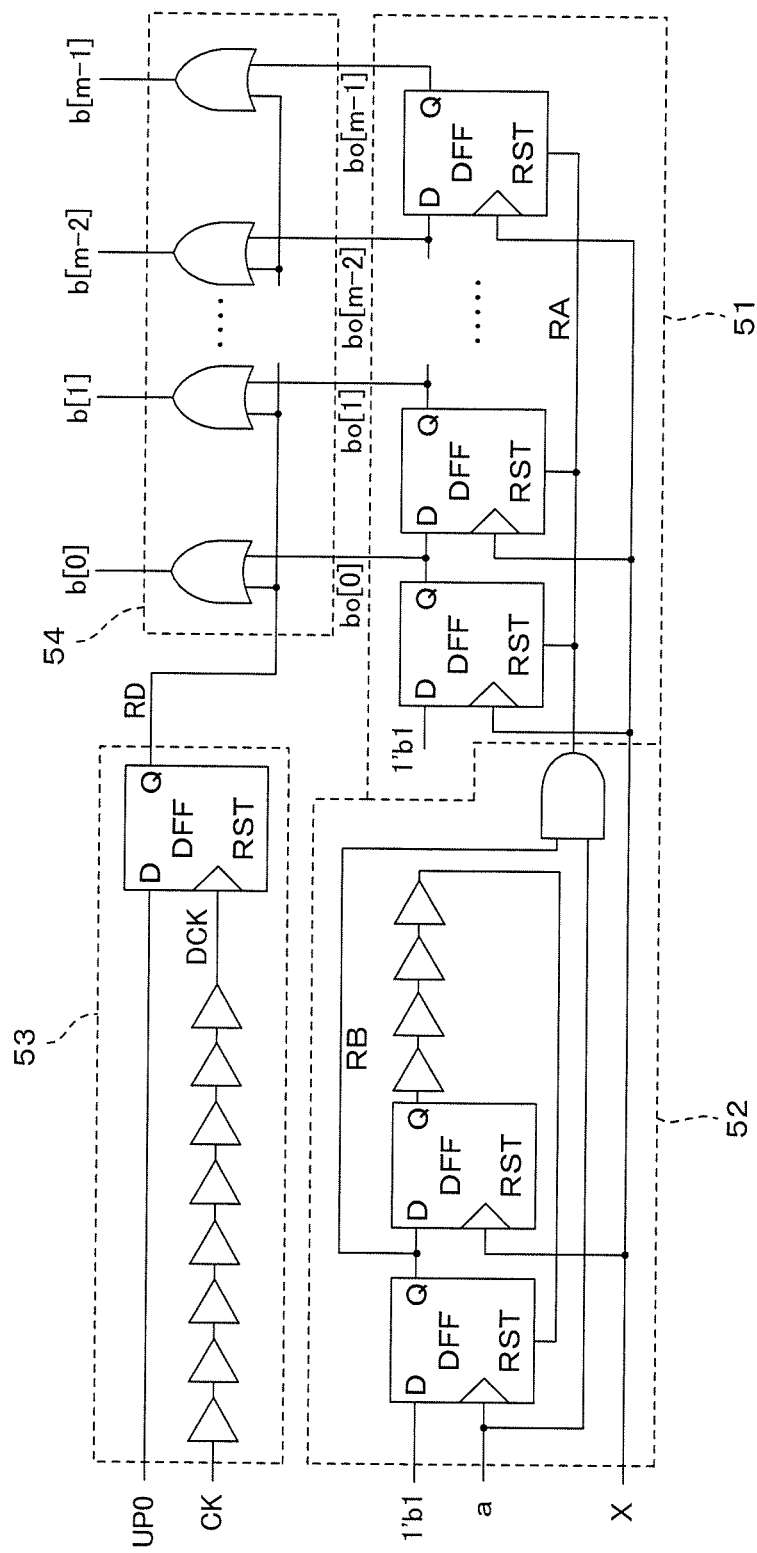
FIG. 13 is a circuit diagram illustrating a structure of the switch controller of the PLL circuit according to Modification 3.

FIG. 13 is a circuit diagram illustrating the structure of the switch controller 27. As illustrated in FIG. 13, the switch controller 27 includes an m-stage shift register 51, a reset signal generator 52, a control signal generator 53, and an output unit 54. The shift register 51 includes m D-type flip-flops, and generates the switch control signals bo[0] to bo[m−1] from the clock X outputted from the VCO 24. In FIG. 13, 1′b1 indicates a signal in its "HIGH" state.

The reset signal generator 52 includes two D-type flip-flops, a delay circuit formed of plural buffers (e.g. four buffers in FIG. 13), and an AND circuit. The reset signal generator 52 receives input of the switch control signal a and the clock X, and generates a reset signal RA to reset the shift register 51.

Also, the control signal generator 53 includes a D-type flip-flop, and a delay circuit formed of plural buffers (e.g. eight buffers in FIG. 13). The control signal generator 53 receives input of the Up signal UP0 and the input clock CK, and outputs a control signal RD.

The output unit 54 includes m OR circuits. The output unit 54 receives input of the switch control signals bo[0] to bo[m−1] outputted from the shift register 51 and the control signal RD outputted from the control signal generator 53, and outputs the switch control signals b[0] to b[m−1] which sequentially make a "LOW" to "HIGH" transition at predetermined time points.

Figure 14:
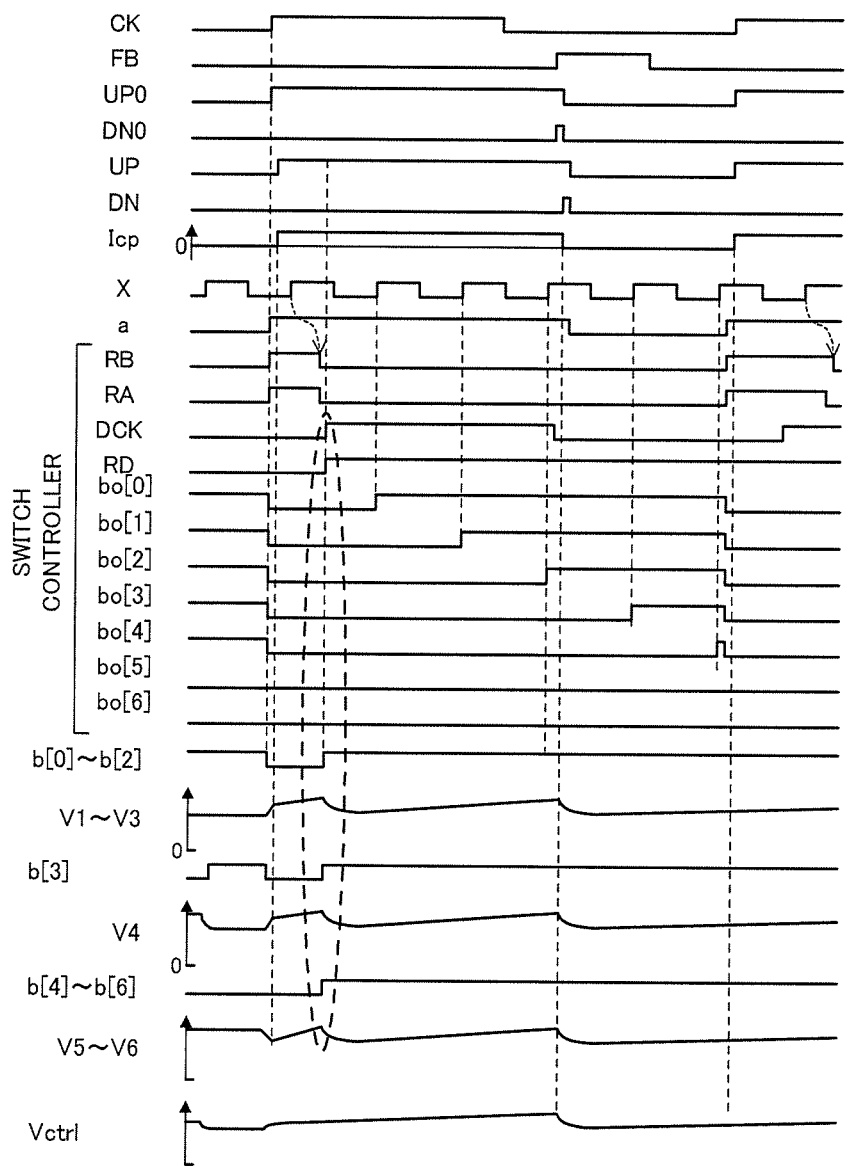
FIG. 14 is a timing chart (Part 1) illustrating operation of the PLL circuit according to Modification 3.
Figure 15:
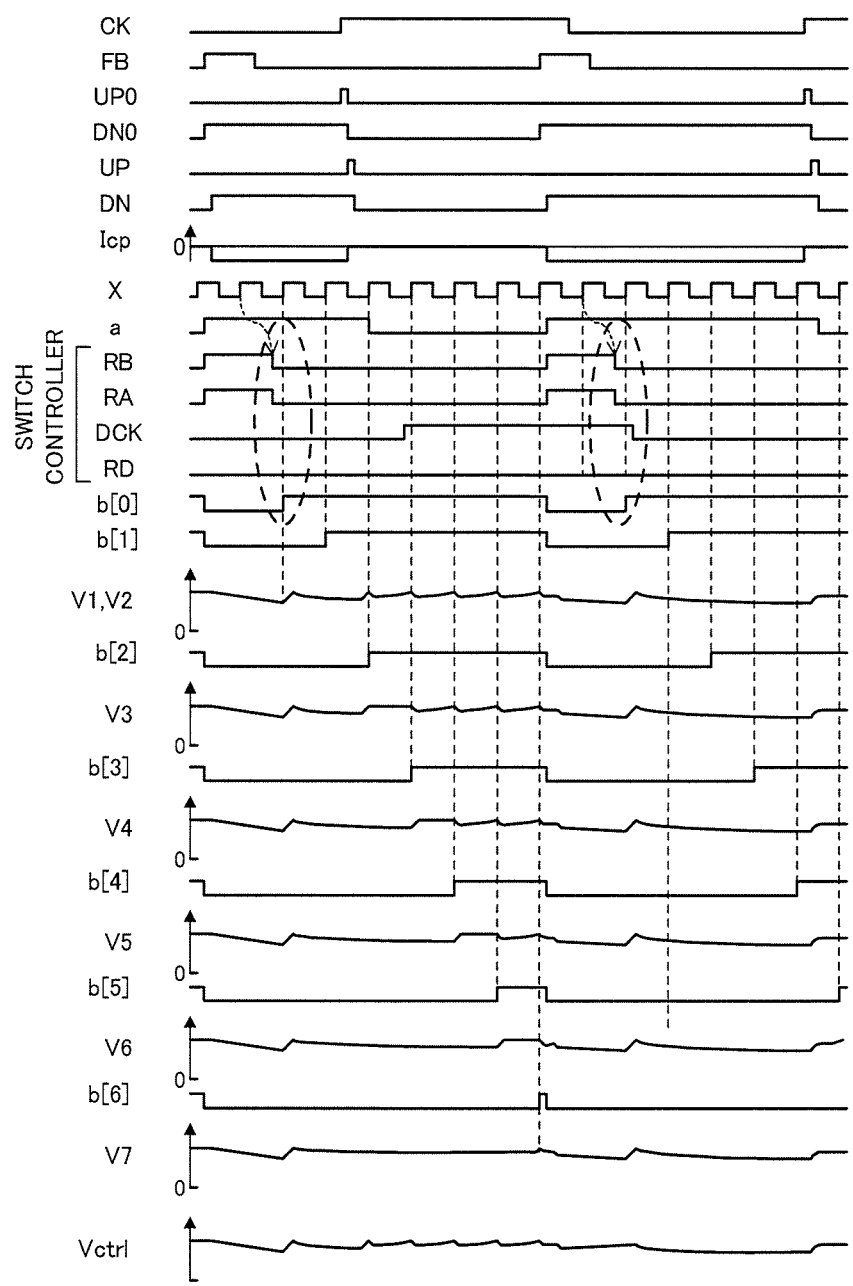
FIG. 15 is a timing chart (Part 2) illustrating operation of the PLL circuit according to Modification 3.
Figure 16:
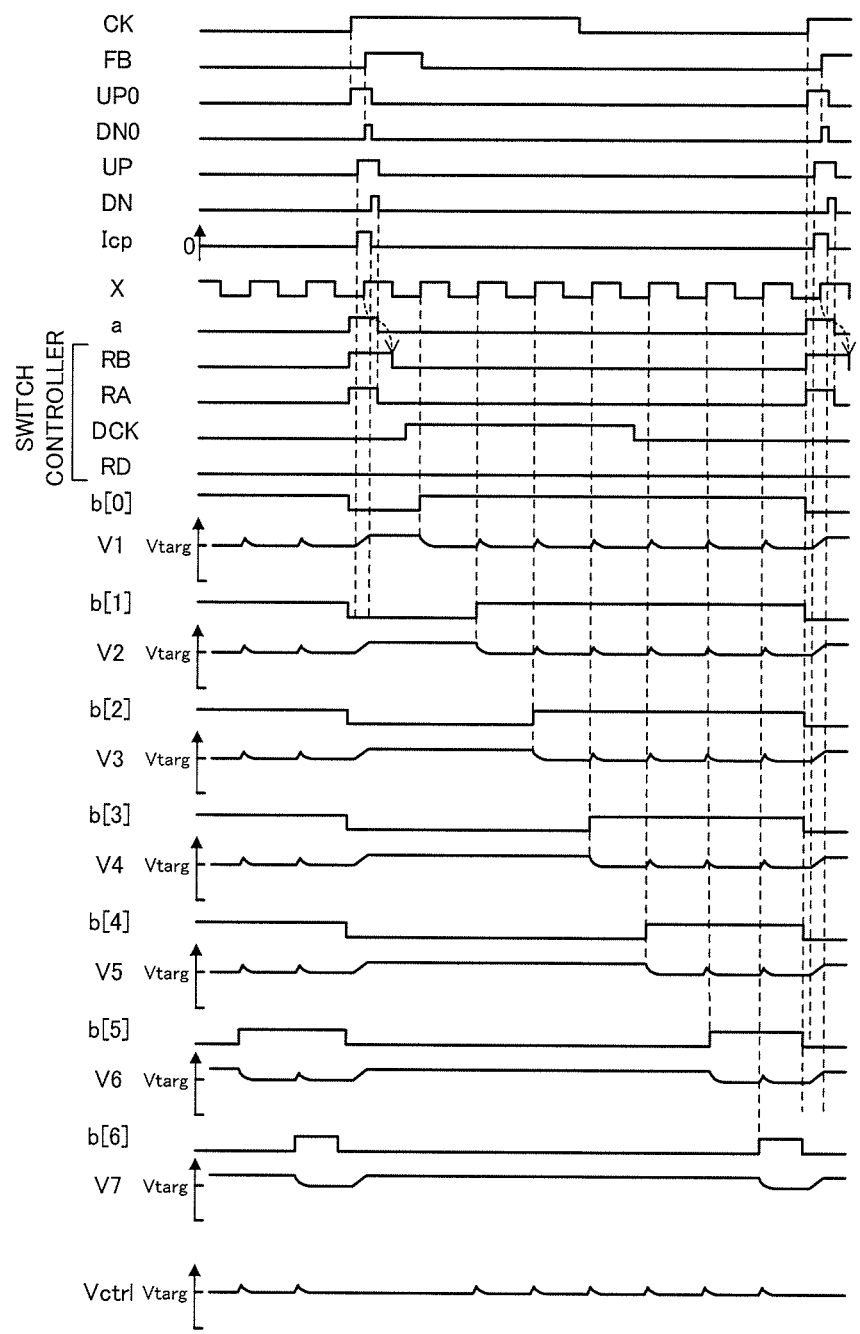
FIG. 16 is a timing chart (Part 3) illustrating operation of the PLL circuit according to Modification 3.

FIGS. 14 to 16 are timing charts illustrating operation of the PLL circuit according to Modification 3. Like Modification 1, here, the number m of charge storage circuits in the low-pass filter 23 is set equal to 7 (m=7), and the frequency division factor (or the frequency multiplication factor) N of the frequency divider 25 is set equal to 8 (N=8). FIG. 14 illustrates operation under conditions where an output frequency is lower than a desired frequency, and FIG. 15 illustrates operation under conditions where the output frequency is higher than the desired frequency. Also, FIG. 16 illustrates operation under phase-locked conditions.

As be seen from FIGS. 14 to 16, in Modification 3, the switch controller 27 operates even under non-phase-locked conditions.

When the output frequency is lower than the desired frequency, a period of time when the Up signal UP is "HIGH" is long as illustrated in FIG. 14. The switch control signal a also is "HIGH" during the period of time when the Up signal UP is "HIGH." Also, in the control signal generator 53, the control signal RD becomes "HIGH" when the Up signal UP0 is "HIGH" on the rising edge of a signal DCK obtained by delaying the input clock CK. Thereby, the switch control signals b[0] to b[6] all become "HIGH." Then, the charge pump current Icp outputted from the charge pump 22 is transmitted to the succeeding stage circuit portion 23b of the low-pass filter 23 through the switches 33[1] to 33[7] and the switches 34[1] to 34[7], and the control voltage Vctrl rises. As a result, the frequency of the clock X outputted from the VCO 24 increases.

When the output frequency is higher than the desired frequency, a period of time when the Down signal DN is "HIGH" is long as illustrated in FIG. 15. The switch control signal a also is "HIGH" during the period of time when the Down signal DN is "HIGH." When the clock X rises after the switch control signal a has risen, a control signal RB is reset to zero after a lapse of a delay time given by the plural buffers (e.g. the four buffers in FIG. 13). Thereby, the reset signal RA also becomes "LOW," and the reset of the shift register 51 is canceled. Then, even during the period of time when the Down signal DN is "HIGH," the switch control signals b[0] to b[6] sequentially become "HIGH," and the switches 34[0] to 34[m] are sequentially turned on. Thereby, the charge pump current Icp outputted from the charge pump 22 is transmitted to the succeeding stage circuit portion 23b of the low-pass filter 23 through the switches 34[1] to 34[7], and the control voltage Vctrl drops. As a result, the frequency of the clock X outputted from the VCO 24 decreases.

When the PLL circuit is in a phase-locked state, the Up signal UP and the Down signal DN become narrow in their pulse as illustrated in FIG. 16. Also, when the PLL circuit is in the phase-locked state, the switch control signal a becomes "HIGH," and electric charges according to the charge pump current Icp are stored in capacitors C[1] to C[7]. After that, the switch control signal a becomes "LOW," the switch control signals b[0] to b[7] sequentially become "HIGH," and the electric charges stored in the capacitors C[1] to C[7] are sequentially transferred to the succeeding stage circuit portion 23b.

In the PLL circuit according to the first embodiment, factors such as disturbance may possibly cause a sharp change in frequency; however, when the PLL circuit becomes unlocked, the lock detector 26 operates to turn on the switches 33[1] to 33[m] and the switches 34[1] to 34[m], and the PLL circuit is restored to the locked state. However, when the lock detector 26 does not operate immediately at the occurrence of unlocking, the duration of the clock X in an unsettled state becomes long.

On the other hand, in the PLL circuit of Modification 3, the switch controller 27 operates even under non-phase-locked conditions, and thus, even when the PLL circuit becomes unlocked due to some factor, the PLL circuit is immediately restored to the locked state.

(Modification 4)

In the first embodiment, the succeeding stage circuit portion 23b of the low-pass filter 23 is illustrated by example as being formed of the capacitor Cp connected between the node N2 and the ground, and the resistor Rs and the capacitor Cs connected in series between the node N2 and the ground (see FIG. 5). However, it is to be understood that the succeeding stage circuit portion 23b is not limited to the circuit illustrated in FIG. 5 but may be formed of other circuits.

Figure 17:
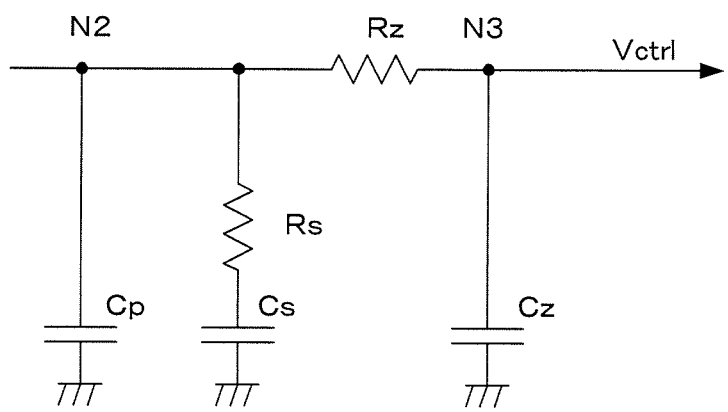
FIG. 17 is a diagram illustrating a structure of a succeeding stage circuit portion of a PLL circuit according to Modification 4.

In FIG. 17, the succeeding stage circuit portion 23b is illustrated by example as being formed of the capacitors Cp, Cs, Cz and the resistors Rs, Rz. The capacitor Cp is connected between the node N2 and the ground, and the resistor Rs and the capacitor Cs are connected in series between the node N2 and the ground. Also, the resistor Rz is connected between the node N2 and a node N3 (or an output terminal), and the capacitor Cz is connected between the node N3 and the ground.

Second Embodiment

Figure 18:
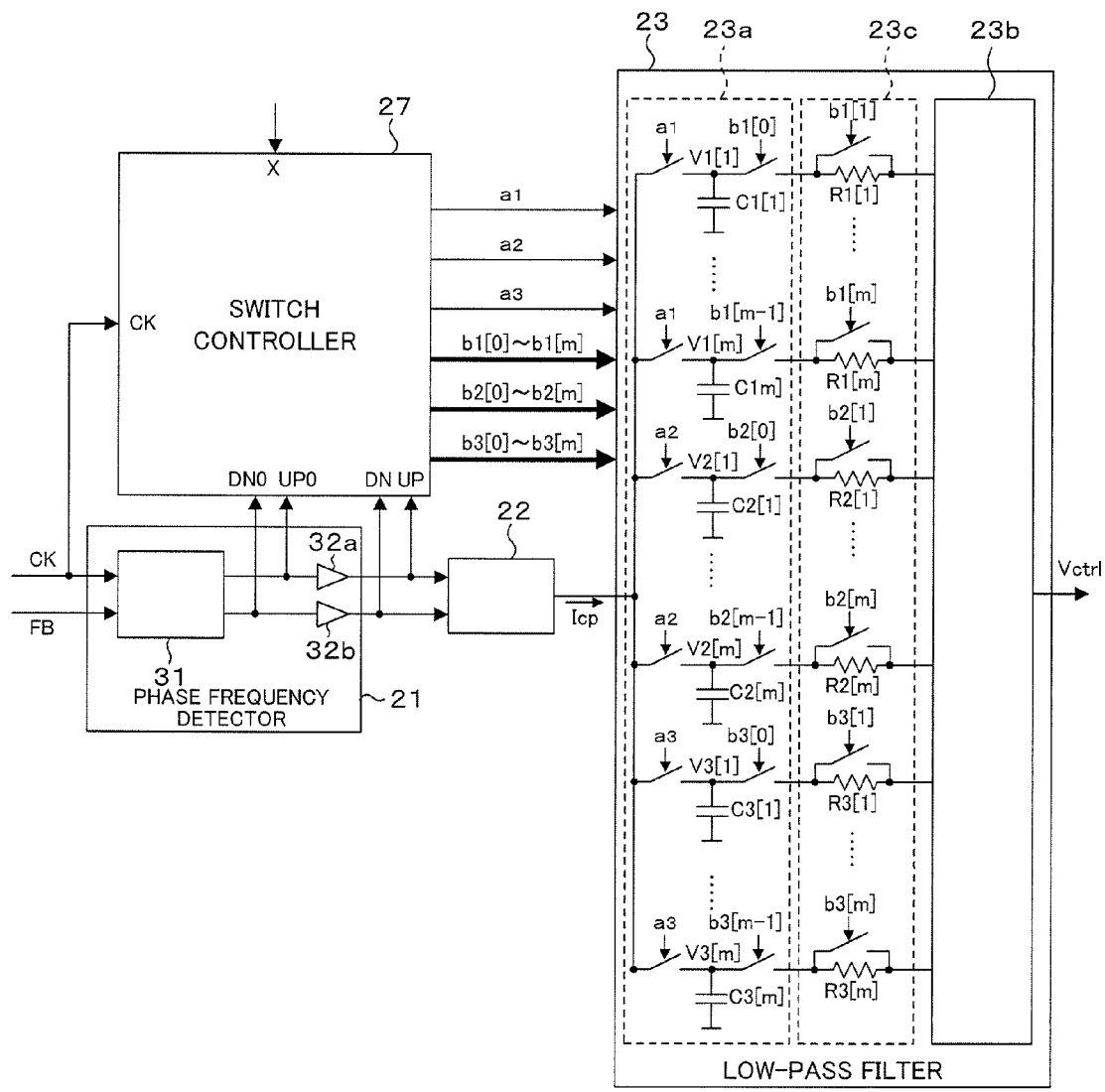
FIG. 18 is a circuit diagram illustrating a phase frequency detector, a charge pump, a switch controller and a low-pass filter of a PLL circuit according to a second embodiment.
Figure 19:
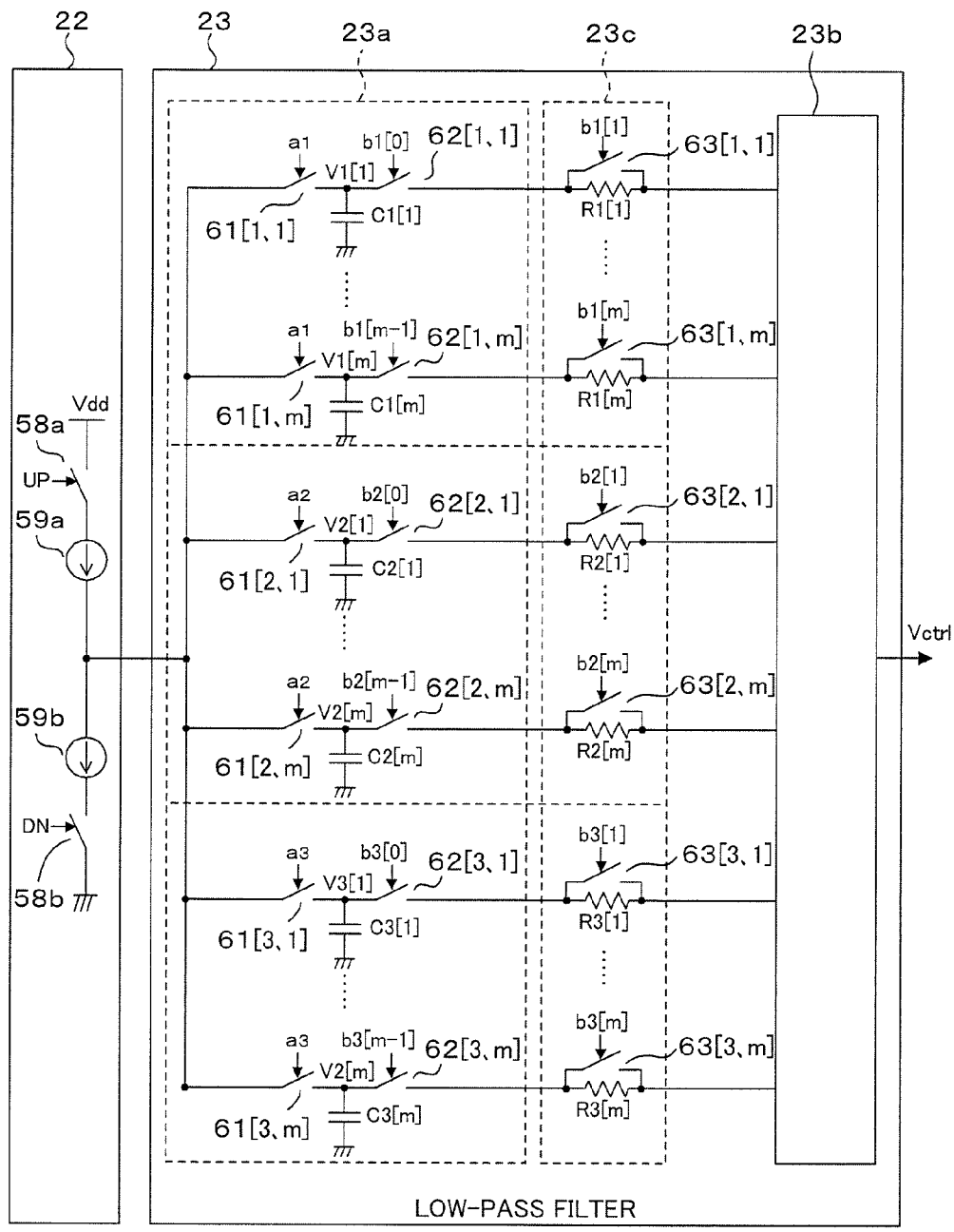
FIG. 19 is a circuit diagram illustrating the charge pump and the phase frequency detector.

FIG. 18 is a circuit diagram illustrating a phase frequency detector, a charge pump, a switch controller and a low-pass filter of a PLL circuit according to a second embodiment. Also, FIG. 19 is a circuit diagram illustrating the charge pump and the phase frequency detector. Incidentally, the second embodiment is different from the first embodiment in respect of structures of the switch controller and the low-pass filter and other structures are basically the same as those of the first embodiment, and therefore, description of overlaps will be omitted.

As illustrated in FIG. 18, the phase frequency detector 21 includes the phase comparator 31 and the buffers 32a, 32b. The phase comparator 31 receives input of the input clock CK and the feedback clock FB, and outputs the Up signal UP0 and the Down signal DN0 according to the phase difference between the input clock CK and the feedback clock FB. The buffer 32a receives input of the Up signal UP0 and outputs the Up signal UP. Also, the buffer 32b receives input of the Down signal DN0 and outputs the Down signal DN.

As illustrated in FIG. 19, the charge pump 22 includes a switch 58a and a current source 59a connected in series between a power line Vdd and an output terminal, and a switch 58b and a current source 59b connected in series between the output terminal and the ground. The switch 58a is turned on or off by the Up signal UP outputted from the phase frequency detector 21, and the switch 58b is turned on or off by the Down signal DN outputted from the phase frequency detector 21. Then, the charge pump 22 outputs the charge pump current Icp according to the Up signal UP and the Down signal DN outputted from the phase frequency detector 21.

As illustrated in FIG. 18, the switch controller 27 receives input of the input clock CK, the clock X outputted from the VCO 24 (see FIG. 5), and the Up signal UP0, the Down signal DN0, the Up signal UP and the Down signal DN outputted from the phase frequency detector 21. Then, the switch controller 27 outputs switch control signals a1 to a3 and switch control signals b1[0] to b1[m], b2[0] to b2[m], b3[0] to b3[m] according to the received input signals.

The low-pass filter 23 includes the preceding stage circuit portion 23a, the time constant adjustment unit 23c and the succeeding stage circuit portion 23b. The preceding stage circuit portion 23a is provided with an equal number of charge storage circuits to a multiple or divisor of the frequency division factor of the frequency divider 25. In the second embodiment, the number of charge storage circuits provided is set to be three times the frequency division factor N of the frequency divider 25. As illustrated in FIG. 19, the charge storage circuits are divided into three groups.

A first group includes m switches 61[1,1] to 61[1,m], m switches 62[1,1] to 62[1,m], and m capacitors C1[1] to C1[m]. The switch 61[1,n] (where n is any integer between 1 and m) and the switch 62[1,n] are connected in series, and the capacitor C1[n] is connected between a node V1[n] between the switch 61[1,n] and the switch 62[1,n] and the ground. The switches 61[1,1] to 61[1,m] are turned on or off by the switch control signal a1, and the switch 62[1,n] is turned on or off by the switch control signal b1[n−1].

Likewise, a second group includes m switches 61[2,1] to 61[2,m], m switches 62[2,1] to 62[2,m], and m capacitors C2[1] to C2[m]. The switch 61[2,n] (where n is any integer between 1 and m) and the switch 62[2,n] are connected in series, and the capacitor C2[n] is connected between a node V2[n] between the switch 61[2,n] and the switch 62[2,n] and the ground. The switches 61[2,1] to 61[2,m] are turned on or off by the switch control signal a2, and the switch 62[2,n] is turned on or off by the switch control signal b2[n−1].

Also, a third group includes m switches 61[3,1] to 61[3,m], m switches 62[3,1] to 62[3,m], and m capacitors C3[1] to C3[m]. The switch 61[3,n] (where n is any integer between 1 and m) and the switch 62[3,n] are connected in series, and the capacitor C3[n] is connected between a node V3[n] between the switch 61[3,n] and the switch 62[3,n] and the ground. The switches 61[3,1] to 61[3,m] are turned on or off by the switch control signal a3, and the switch 62[3,n] is turned on or off by the switch control signal b3[n−1].

In the second embodiment, the capacitance values of the capacitors C1[1] to C1[m], C2[1] to C2[m], C3[1] to C3[m] are all set equal.

The time constant adjustment unit 23c is also divided into three groups corresponding to the preceding stage circuit portion 23a. A first group includes m resistors R1[1] to R1[m], and m switches 63[1,1] to 63[1,m]. The resistor R1[n] (where n is any integer between 1 and m) and the switch 63[1,n] are connected in parallel between the switch 62[1,n] of the preceding stage circuit portion 23a and the succeeding stage circuit portion 23b. The switch 63[1,n] is turned on or off by the switch control signal b1[n].

Likewise, a second group includes m resistors R2[1] to R2[m], and m switches 63[2,1] to 63[2,m]. The resistor R2[n] and the switch 63[2,n] are connected in parallel between the switch 62[2,n] of the preceding stage circuit portion 23a and the succeeding stage circuit portion 23b. The switch 63[2,n] is turned on or off by the switch control signal b2[n].

Also, a third group includes m resistors R3[1] to R3[m], and m switches 63[3,1] to 63[3,m]. The resistor R3[n] and the switch 63[3,n] are connected in parallel between the switch 62[3,n] of the preceding stage circuit portion 23a and the succeeding stage circuit portion 23b. The switch 63[3,n] is turned on or off by the switch control signal b3[n].

Like the first embodiment, the succeeding stage circuit portion 23b is formed for example of the capacitors Cp, Cs and the resistor Rs (see FIG. 5).

Figure 20:
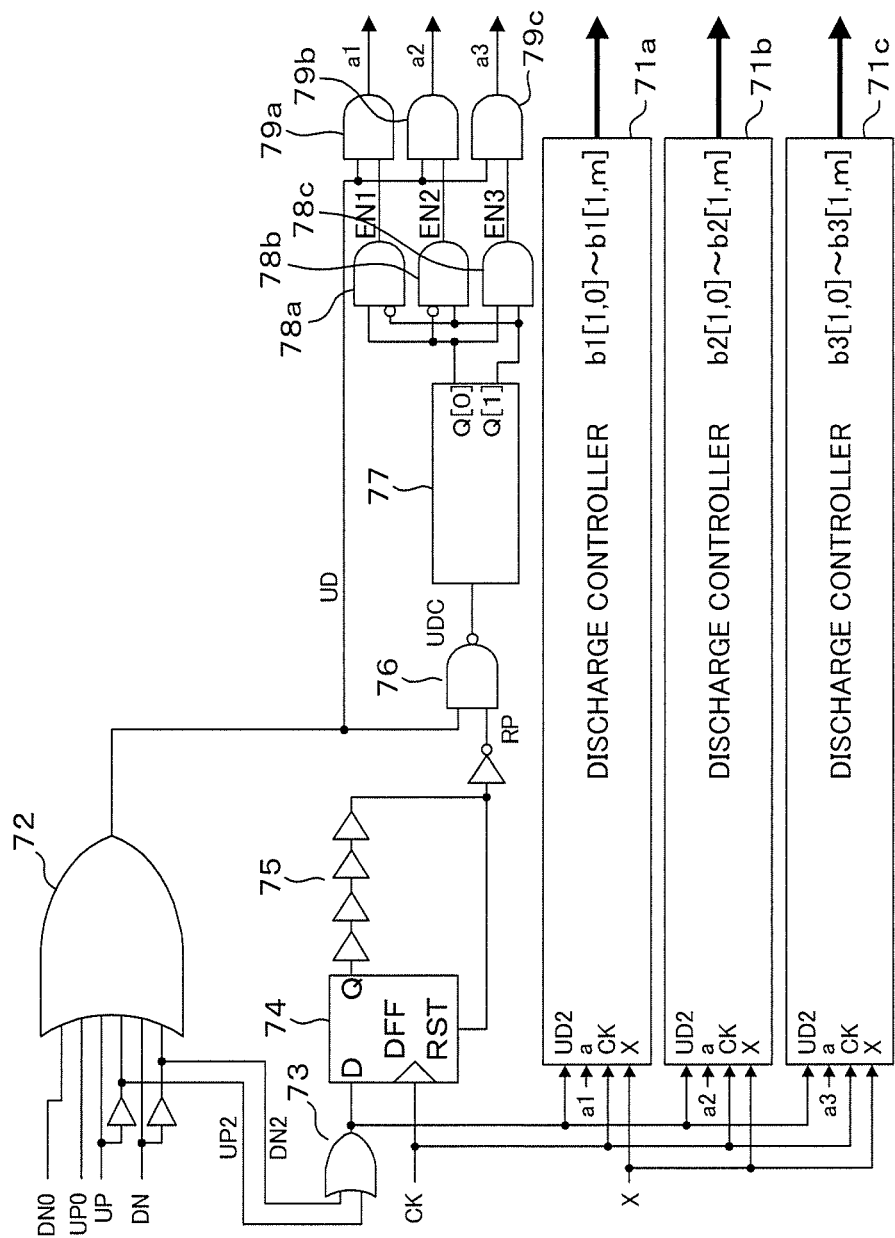
FIG. 20 is a circuit diagram illustrating a structure of the switch controller of the second embodiment.

FIG. 20 is a circuit diagram illustrating the structure of the switch controller 27 of the second embodiment. As illustrated in FIG. 20, the switch controller 27 includes three discharge controllers 71a to 71c, an OR circuit 72 with six inputs, an OR circuit with two inputs, a D-type flip-flop 74, a delay circuit 75 formed of plural buffers, a NAND circuit 76, a ternary counter 77, and AND circuits 78a to 78c and 79a to 79c each with two inputs.

The OR circuit 72 with six inputs receives input of the Down signal DN0, the Up signal UP0, the Up signal UP, an Up signal UP2, the Down signal DN and a Down signal DN2, and outputs an Up-Down signal UD. Incidentally, the Up signal UP2 is the output signal from the buffer to which the Up signal UP is inputted, and the Down signal DN2 is the output signal from the buffer to which the Down signal DN is inputted.

The OR circuit 73 with two inputs receives input of the Up signal UP2 and the Down signal DN2, and outputs an Up-Down signal UD2. The D-type flip-flop 74 receives input of the output (UD2) from the OR circuit 73 with two inputs and the input clock CK. Then, an output of the D-type flip-flop 74 is inputted to a reset terminal RST of the D-type flip-flop 74 through the delay circuit 75. The NAND circuit 76 receives input of the output from the OR circuit 72 with six inputs and a signal obtained by inverting an output from the delay circuit 75, and outputs an Up-Down clock UDC. The ternary counter 77 counts the Up-Down clock UDC outputted from the NAND circuit 76, and outputs signals Q[0], Q[1].

The AND circuit 78a receives input of the output signal Q[0] from the ternary counter 77 and a signal obtained by inverting the output signal Q[1], and outputs a signal EN1. Also, the AND circuit 78b receives input of the output signal Q[1] from the ternary counter 77 and a signal obtained by inverting the output signal Q[0], and outputs a signal EN2. Further, the AND circuit 78c receives input of the output signals Q[0], Q[1] from the ternary counter 77, and outputs a signal EN3.

The AND circuit 79a receives input of the Up-Down signal UD and the signal EN1, and outputs the switch control signal a1. Also, the AND circuit 79b receives input of the Up-Down signal UD and the signal EN2, and outputs the switch control signal a2. Further, the AND circuit 79c receives input of the Up-Down signal UD and the signal EN3, and outputs the switch control signal a3.

The discharge controller 71a receives input of the output (i.e. the Up-Down signal UD2) from the OR circuit 73, the switch control signal a1, the input clock CK, and the clock X outputted from the VCO 24, and outputs switch control signals b1[1,0] to b1[1,m].

Likewise, the discharge controller 71b receives input of the output (i.e. the Up-Down signal UD2) from the OR circuit 73, the switch control signal a2, the input clock CK, and the clock X outputted from the VCO 24, and outputs switch control signals b2[1,0] to b2[1,m]. Also, the discharge controller 71c receives input of the output (i.e. the Up-Down signal UD2) from the OR circuit 73, the switch control signal a3, the input clock CK, and the clock X outputted from the VCO 24, and outputs switch control signals b3[1,0] to b3[1,m].

Figure 21:
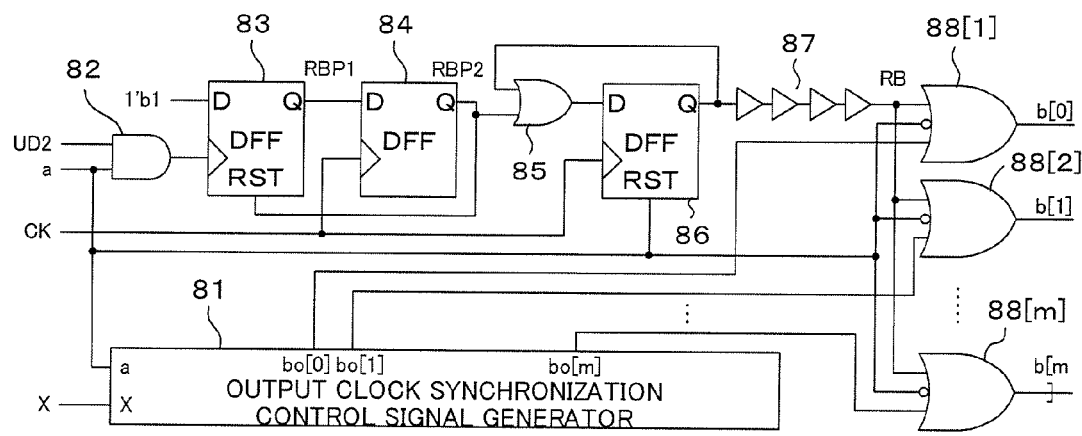
FIG. 21 is a circuit diagram illustrating a structure of discharge controllers.

FIG. 21 is a circuit diagram illustrating a structure of the discharge controllers 71a to 71c.

The discharge controllers 71a to 71c each include an output clock synchronization control signal generator 81, an AND circuit 82, D-type flip-flops 83, 84, 86, an OR circuit 85, a delay circuit 87, and m OR circuits 88[1] to 88[m] each with three inputs.

The output clock synchronization control signal generator 81 receives input of the switch control signal a (a1, a2 or a3) and the clock X, and outputs signals bo[0] to bo[m]. The AND circuit 82 receives input of the Up-Down signal UD2 and the switch control signal a. The D-type flip-flop 83 receives input of the signal 1'b1 ("HIGH") and an output from the AND circuit 82, and outputs a signal RBP1. The D-type flip-flop 84 receives input of the signal RBP1 and the input clock CK, and outputs a signal RBP2. The signal RBP2 is inputted to the OR circuit 85 and a reset terminal of the D-type flip-flop 83.

The OR circuit 85 receives input of the signal RBP2 and an output from the D-type flip-flop 86. Also, the D-type flip-flop 86 receives input of an output from the OR circuit 85 and the input clock CK. An output from the D-type flip-flop 86 is inputted as the signal RB to the OR circuits 88[1] to 88[m] each with three inputs, through the delay circuit 87 formed of plural buffers.

The OR circuit 88[n] with three inputs (where n is any integer between 1 and m) receives input of the signal RB, an inverted signal of the switch control signal a, and the signal bo[n] outputted from the output clock synchronization control signal generator 81, and outputs the switch control signal b[n−1].

Figure 22:
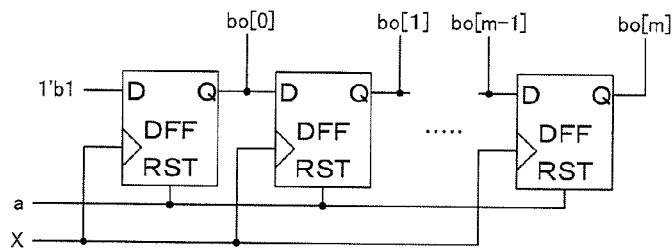
FIG. 22 is a circuit diagram illustrating a structure of an output clock synchronization control signal generator.

FIG. 22 is a circuit diagram illustrating a structure of the output clock synchronization control signal generator 81. As illustrated in FIG. 22, the output clock synchronization control signal generator 81 is a shift register formed of (m+1) D-type flip-flops which receive input of the signal 1'b1 ("HIGH") and the clock X and are reset by the switch control signal a.

In the first embodiment, electric charges produced by the charge pump current Icp are stored in the capacitors C1 to Cm of the preceding stage circuit portion 23a of the low-pass filter 23, and the electric charges are divided into m portions, which are then transmitted one after another to the succeeding stage circuit portion 23b. In this case, when the next time point of supply of the charge pump current Icp comes before the completion of transfer of the electric charges stored in the capacitors C1 to Cm to the succeeding stage circuit portion 23b, the clock X outputted from the VCO 24 deviates from a desired clock.

In the second embodiment, therefore, the group to store the electric charges produced by the charge pump current Icp is provided separately from the group to supply the electric charges to the succeeding stage circuit portion 23b. Thereby, deviation of the clock X outputted from the VCO 24 may be prevented with higher reliability.

Figure 23:
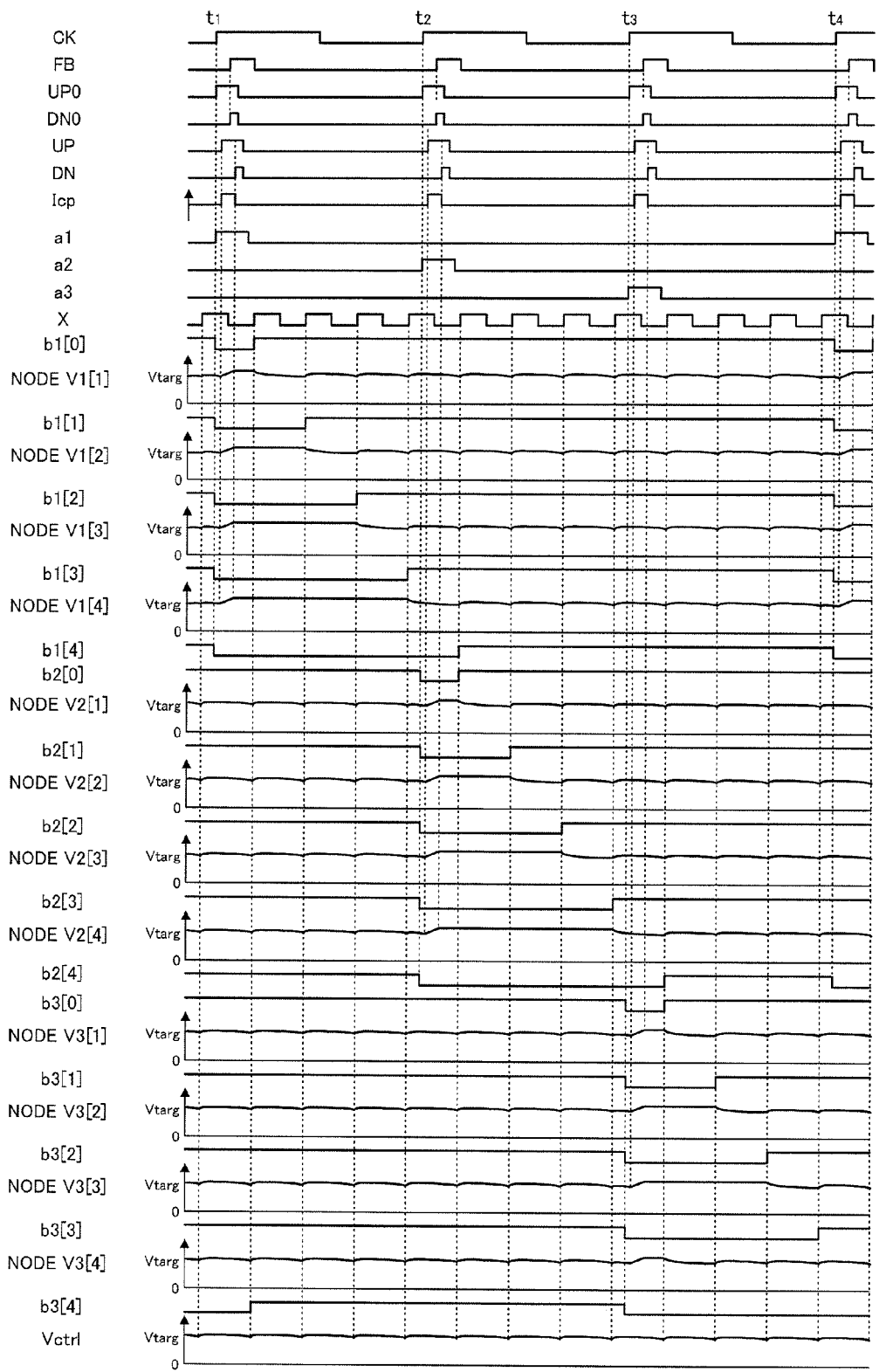
FIG. 23 is a representation of a timing chart under phase-locked conditions.

FIG. 23 is a representation of a timing chart under phase-locked conditions. It is to be noted here that the frequency division factor (or the frequency multiplication factor) N of the frequency divider 25 is set equal to 4 (N=4). Also, the number m of charge storage circuits in each group is set equal to 4 (m=N=4).

When the switch control signal a1 becomes "HIGH" at time point t1, the switches 61[1] to 61[4] are turned on, electric charges according to the charge pump current Icp are stored in the capacitors C1[1] to C1[4], and the nodes V1[1] to V1[4] become equal in voltage.

After that, the switch control signals b1[0] to b1[3] sequentially become "HIGH," and the electric charges stored in the capacitors C1[1] to C1[4] are transmitted to the succeeding stage circuit portion 23b through the switches 62[1,1] to 62[1,4] and the time constant adjustment unit 23c. At this time point, the turn-on of the switch 63[1,n] lags a period of the clock X behind the turn-on of the switch 62[1,n], and thereby, the resistors R1[1] to R1[m] adjust a time constant at which the electric charges flow from the preceding stage circuit portion 23a into the succeeding stage circuit portion 23b, thus achieving further suppression of variations in the control voltage Vctrl. Preferably, the time constant is of the order of ⅒ to ½ of a period of the output, for example.

In the second embodiment, the switch control signal a2 becomes "HIGH" at time point t2, and electric charges according to the charge pump current Icp from the charge pump 22 are stored in the capacitors C2[1] to C2[4]. At this time point, although the electric charges to be supplied to the succeeding stage circuit portion 23b remain in the capacitor C1[4], the transfer of the electric charges in the capacitor C1[4] is completed before the switch 62[2,1] is turned on. Thus, the control voltage Vctrl may be set to a predetermined voltage thereby to suppress reference spurious.

Between the time point t2 and time point t3, electric charges according to the charge pump current Icp are stored in the capacitors C2[1] to C2[4], and the electric charges are sequentially fed to the succeeding stage circuit portion 23b through the switches 62[2,1] to 62[2,4]. Between the time point t3 and time point t4, also, electric charges according to the charge pump current Icp are stored in the capacitors C3[1] to C3[4], and the electric charges are sequentially fed to the succeeding stage circuit portion 23b through the switches 62[3,1] to 62[3,4].

Also in the second embodiment, electric charges according to the charge pump current Icp supplied from the charge pump 22 are simultaneously stored in plural capacitors and, thereafter, are supplied in order to the succeeding stage circuit portion 23b, thus suppressing variations in the control voltage Vctrl under phase-locked conditions. Also, although the control voltage Vctrl varies slightly under the phase-locked conditions, the variations in the control voltage Vctrl are in synchronization with the output clock X, and thus, the control voltage Vctrl varies in the same way at every period of the output. Therefore, jitter of the clock X caused by the variations in the control voltage Vctrl is almost negligible.

Figure 24:
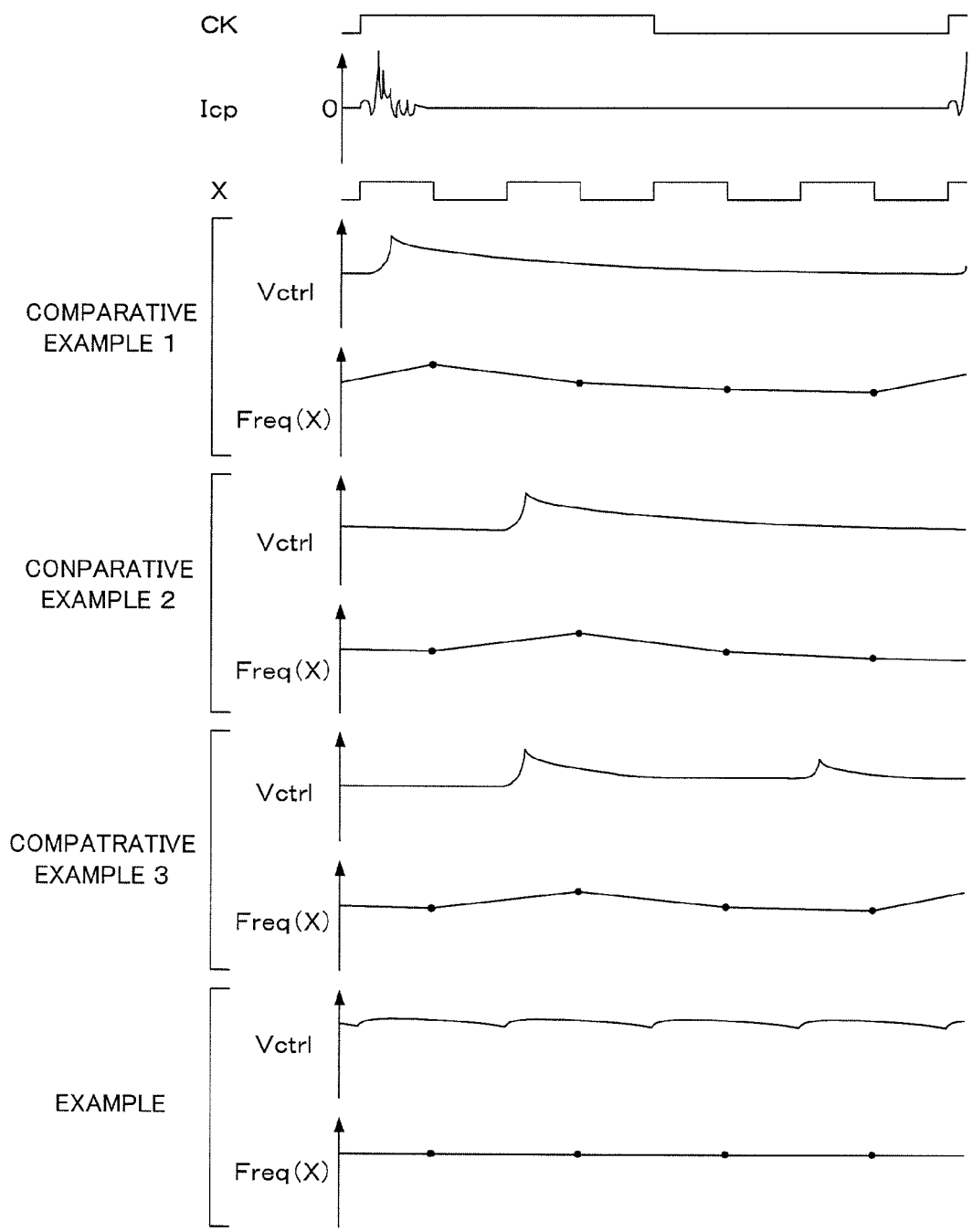
FIG. 24 is a chart illustrating comparisons of variations in control voltages and output frequencies of the PLL circuit according to the second embodiment and PLL circuits of Comparative Examples.

FIG. 24 is a chart illustrating comparisons of variations in control voltages and output frequencies of the PLL circuit according to the second embodiment and PLL circuits of Comparative Examples. Comparative Example 1 is a typical PLL circuit formed of a VCO, a phase frequency detector, and a charge pump. Also, Comparative Example 2 is the PLL circuit including the loop filter illustrated in FIG. 2, and Comparative Example 3 is the PLL circuit illustrated in FIG. 1.

In the PLL circuit of Comparative Example 1, the charge pump current Icp flows into the VCO at every period of the input and causes variations in the frequency (Freq) of the output clock X. In the PLL circuit of Comparative Example 2, even with the use of plural capacitors, under phase-locked conditions, the charge pump current Icp flows at the time point of phase comparison, and thus, one or two capacitors store electric charges produced by the charge pump current Icp. Therefore, the effect of reducing reference spurious is little achieved.

In Comparative Example 3, a clock of frequency two times that of the input clock is used by way of example as the sampling clock. In this case, although the amount of variations in the frequency of the output clock X is reduced as compared to Comparative Example 1, the reduced amount is not sufficient.

As compared to Comparative Examples 1 to 3, in the PLL circuit according to the second embodiment (or Example), the control voltage Vctrl varies in synchronization with the output clock X, and thus, the frequency of the output clock X varies little.

Also, in the PLL circuit of Comparative Example 1, the charge pump current may be turned on or off in a short period of time to thus cause a transient flow of a large current and hence an increase in the amount of temporary variations in the control voltage Vctrl. On the other hand, in the second embodiment, electric charges based on the charge pump current Icp are simultaneously stored in the plural capacitors, and the electric charges stored in the capacitors are transferred in turn, thus suppressing transient variations in the control voltage Vctrl.

Incidentally, in the second embodiment, a chip area may possibly be increased because of a use of the switch controller 27 and the plural capacitors C1[1] to C1[m], C2[1] to C2[m], C3[1] to C3[m]. The rate of increase in the chip area depends on the frequency multiplication factor N; however, in the second embodiment, the capacitance values of the capacitors C1[1] to C1[m], C2[1] to C2[m], C3[1] to C3[m] may be set small, so that there is no substantial increase in the chip area. Also, although the second embodiment uses the switch controller 27, the switch controller 27 includes a logic circuit and thus is smaller in its preferable area as compared to an analog circuit, and therefore, the switch controller 27 likewise causes no substantial increase in the chip area.

In the second embodiment, the preceding stage circuit portion 23a is divided into three groups; however, the number of groups into which the preceding stage circuit portion 23a is divided may be set to two, or four or more.

Figure 27:
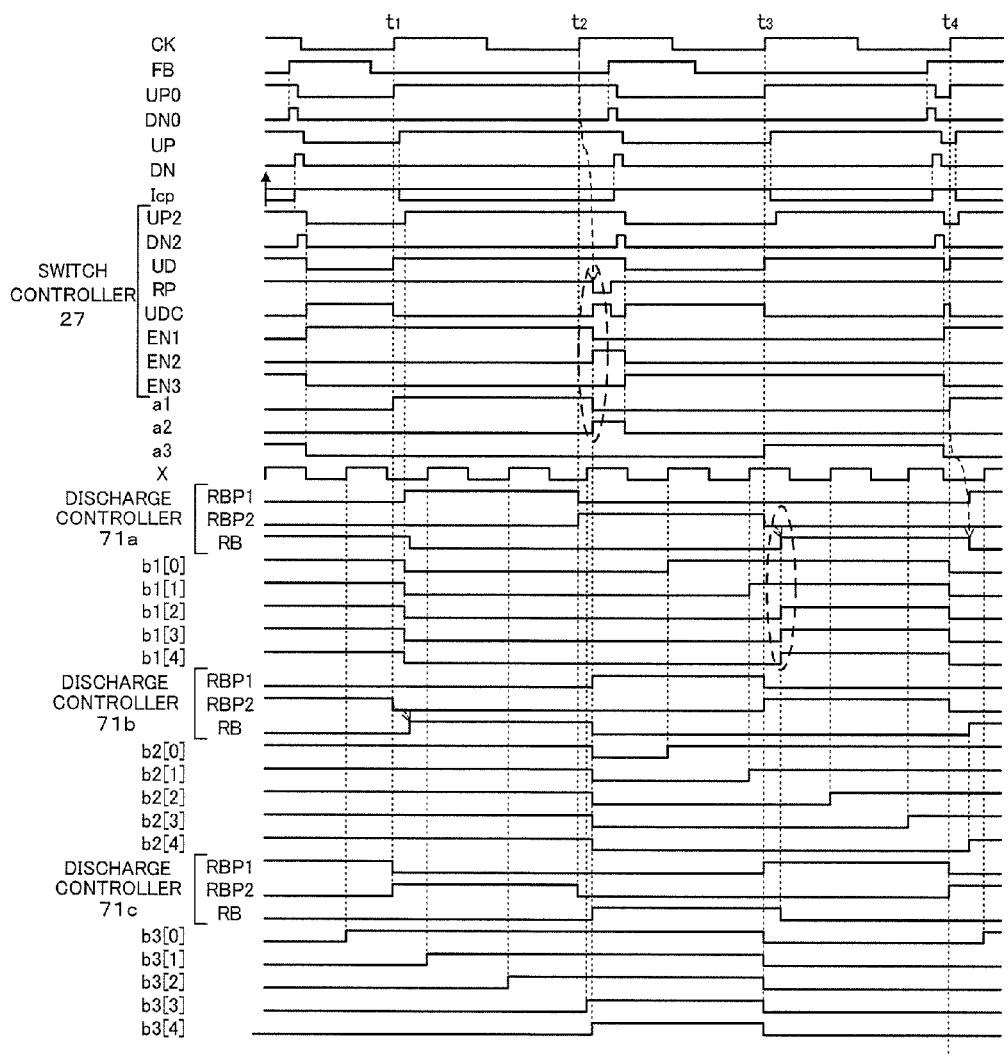
FIG. 27 is a timing chart (Part 2) illustrating operation of the PLL circuit according to the third embodiment.

Operation under conditions where the amount of phase shift is large will be described with reference to a third embodiment given below, by using a timing chart illustrated in FIG. 27. FIG. 27 is identical to the second embodiment except that the charge pump current Icp is opposite in polarity.

Third Embodiment

Figure 25:
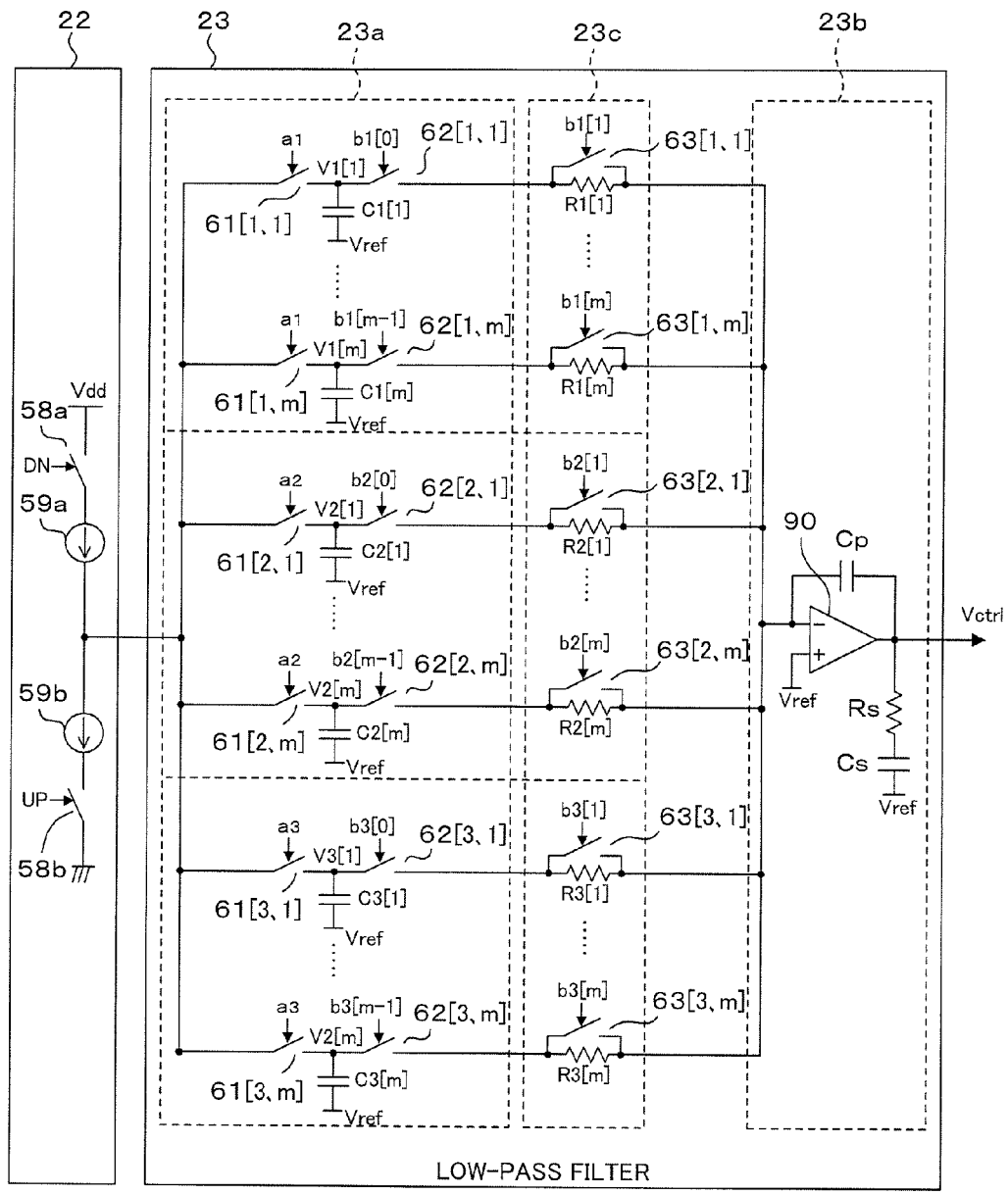
FIG. 25 is a circuit diagram illustrating a charge pump and a low-pass filter of a PLL circuit according to a third embodiment.

FIG. 25 is a circuit diagram illustrating a charge pump and a low-pass filter of a PLL circuit according to the third embodiment. The third embodiment is different from the second embodiment in respect of structures of the charge pump and the low-pass filter and other structures are basically the same as those of the second embodiment, and therefore, in FIG. 25, the same parts as those in FIG. 19 are designated by the same reference characters, and detailed description of the same parts will be omitted.

In the third embodiment, the succeeding stage circuit portion 23b of the low-pass filter 23 includes an operational amplifier 90, the capacitors Cp, Cs, and the resistor Rs. An inverting input terminal (−) of the operational amplifier 90 is connected to an output of the time constant adjustment unit 23c, and a non-inverting input terminal (+) thereof is connected to a power line supplied with a reference voltage Vref. Also, the capacitor Cp is connected between an output terminal and the inverting input terminal of the operational amplifier 90, and the resistor Rs and the capacitor Cs are connected in series between the output terminal of the operational amplifier 90 and the power line supplied with the reference voltage Vref. Incidentally, the resistor Rs and the capacitor Cs may be connected between the output terminal of the operational amplifier 90 and the ground.

Like the second embodiment, the charge pump 22 includes the switch 58a and the current source 59a connected in series between the power line Vdd and the output terminal, and the switch 58b and the current source 59b connected in series between the output terminal and the ground. However, in the second embodiment, the switch 58a is turned on or off by the Up signal UP, and the switch 58b is turned on or off by the Down signal DN. On the other hand, in the third embodiment, the switch 58a is turned on or off by the Down signal DN, and the switch 58b is turned on or off by the Up signal UP.

Also, in the second embodiment, the capacitors C1[$n$], C2[$n$], C3[$n$] are connected between the nodes V1[$n$], V2[$n$], V3[$n$] and the ground. On the other hand, in the third embodiment, the capacitors C1[$n$], C2[$n$], C3[$n$] are connected between the nodes V1[$n$], V2[$n$], V3[$n$] and the power line supplied with the reference voltage Vref.

Figure 26:
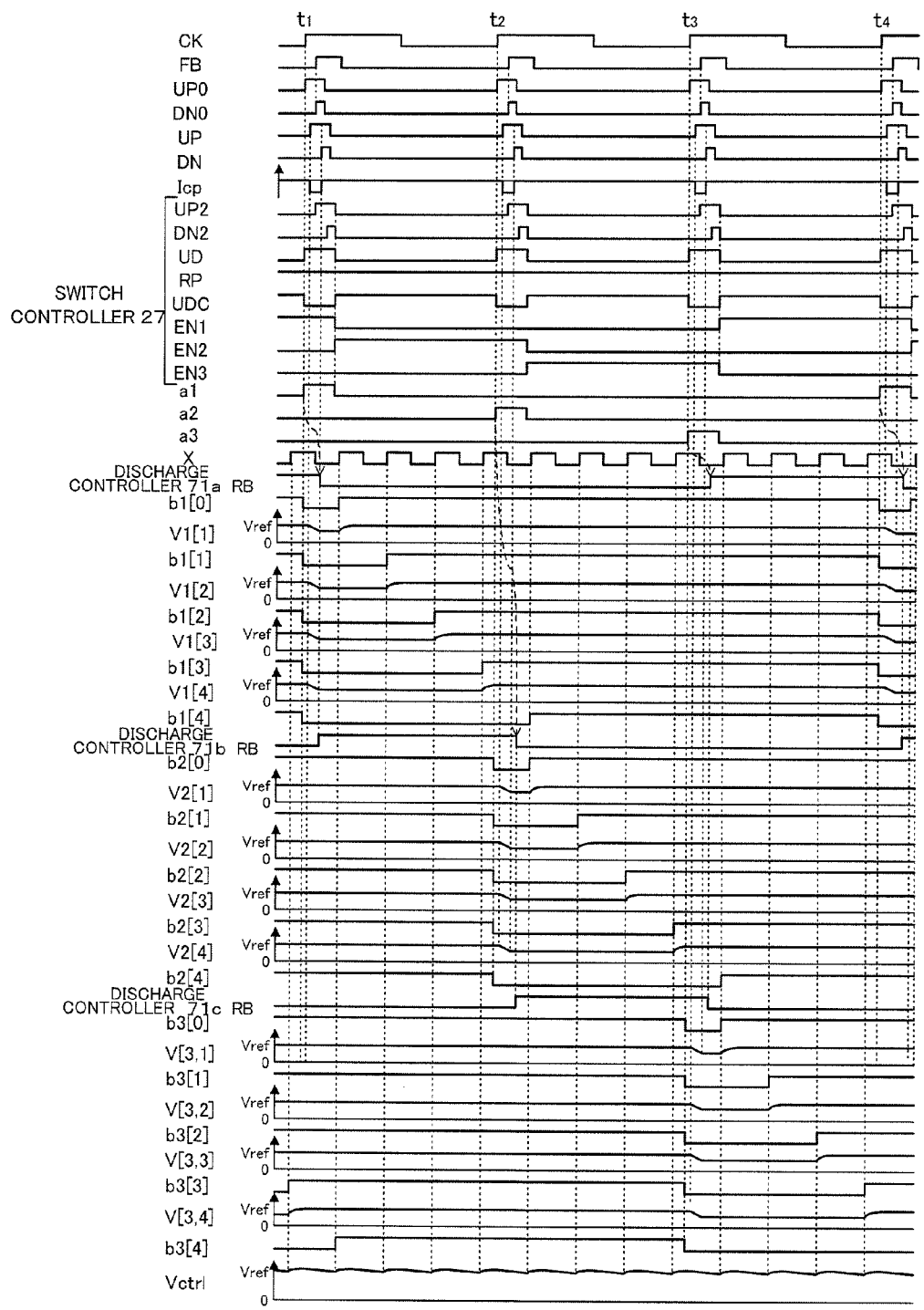
FIG. 26 is a timing chart (Part 1) illustrating operation of the PLL circuit according to the third embodiment.

FIGS. 26 and 27 are timing charts illustrating operation of the PLL circuit according to the third embodiment. FIG. 26 represents the timing chart under phase-locked conditions, and FIG. 27 represents the timing chart under conditions where the amount of phase shift is large. Incidentally, here, the frequency division factor (or the frequency multiplication factor) N of the frequency divider 25 is set equal to 4 (N=4). Also, the number m of charge storage circuits in each group is set equal to 4 (m=N=4).

In the third embodiment, the voltage is inverted in the preceding stage circuit portion 23a, and thus, the charge pump current Icp is opposite in polarity to that in the second embodiment.

Immediately before a time point t1, the voltage of the nodes V1[1] to V1[$m$] is equal to the reference voltage Vref. After that, when the switch control signal a1 becomes "HIGH" at the time point t1, the charge pump current Icp flows into the capacitors C1[1] to C1[4], and electric charges according to the charge pump current Icp are stored in the capacitors C1[1] to C1[4]. Here, a slight amount of time is provided until the switch control signal a1 becomes "LOW" after the charge pump current Icp has finished flowing, in order to wait for the nodes V1[1] to V1[4] to become equal in voltage.

After the switch control signal a1 has become "LOW," the switch control signals b1[1] to b1[4] sequentially become "HIGH" in synchronization with the rising of the clock X, and the electric charges stored in the capacitors C1[1] to C1[4] are sequentially transferred to the capacitor Cp of the succeeding stage circuit portion 23b. At this time, the turn-on of the switch 63[1,$n$] lags a period of the clock X behind the turn-on of the switch 62[1,$n$] thereby to adjust a time constant at which the electric charges are transferred from the capacitor C1[$n$] into the succeeding stage circuit portion 23b, thus preventing a large amount of variations in the control voltage Vctrl. Preferably, the time constant is of the order of 1/10 to 1/2 of the period of the clock X.

Then, the second group starts the same operation at the first next time point (i.e. time point t2) when the charge pump current Icp flows, and further, the third group starts the same operation at the second next time point (i.e. time point t3) when the charge pump current Icp flows.

A signal RP (see FIG. 20) in the switch controller 27 is the signal to switch the switch control signals a1, a2, a3 at the time points in synchronization with the input clock CK. Under phase-locked conditions, however, the signal RP is held "HIGH" at all times.

Next, description will be given with reference to FIG. 27 with regard to operation under conditions where the amount of phase shift is large.

Under conditions where the PLL circuit is low in its output frequency and is not in the phase-locked state, when the Up signal UP0 rises at the time point t1, the switch control signal a1 becomes "HIGH," and after that, the switch control signals b1[0] to b1[4] become "LOW." Thereby, the charge pump current Icp flows into the capacitors C1[1] to C1[4], and electric charges according to the charge pump current Icp are stored in the capacitors C1[1] to C1[4].

Even after the input clock CK rises at the time point t2, the Up signal UP0 remains "HIGH."

When the Up signal UP is great in pulse width, the voltage of the nodes V1[1] to V1[4] reaches the reference voltage Vref maybe to thus make it impossible to store further electric charge, so that operation becomes unstable without the control voltage Vctrl reflecting results of phase comparison. In the third embodiment, therefore, the next time point when the input clock CK rises is detected even if there is no change in the Up signal UP, and the signal RP is driven "LOW" thereby to drive the switch control signal a1 "LOW" and also drive the switch control signal a2 "HIGH." Thereby, the charge pump current Icp comes to flow into the capacitors C2[1] to C2[4] rather than the capacitors C1[1] to C1[4].

Incidentally, in the third embodiment, a longer delay than a delay between the input clock CK and the Up signal UP2 is provided between the rising of the input clock CK and the instant when the signal RP becomes "LOW." The signal RP drives the switch control signal a1 "LOW" and also drives the switch control signal a2 "HIGH."

When the switch control signal a1 becomes "LOW" at the time point t2, the electric charges stored in the capacitors C1[1] to C1[4] are sequentially transferred to the capacitor Cp of the succeeding stage circuit portion 23b in synchronization with the output clock X. At this time, the next time point of charging of the capacitors C2[1] to C2[4] may come before the completion of transfer of the electric charges stored in the capacitors C1[1] to C1[4]. In the third embodiment, therefore, the next time point when the input clock CK rises is detected, and the signal RB is driven "HIGH" thereby to allow the switch control signals b1[2], b1[3], b1[4] to rise.

Thereby, the electric charges stored in the capacitors C1[1] to C1[4] may be all transferred to the capacitor Cp.

Incidentally, in the third embodiment, even if this operation is not performed, the switch control signal b1[3] becomes "HIGH" immediately before time point t4, and the electric charges stored in the capacitor C1[3] may be transferred to the capacitor Cp to thus suppress variations in the control voltage Vctrl. Preferably, however, the signal RB causes the switch control signals b1[2], b1[3], b1[4] to rise as described above in order that the electric charges stored in the capacitors C1[1] to C1[4] are all transferred to the capacitor Cp.

(Modification)

In the second and third embodiments, after the switch control signal a1 has become "LOW," the switch control signals b1[0] to b1[4] are sequentially driven "HIGH" in synchronization with the clock X outputted from the VCO 24. However, when the falling of the switch control signal a1 coincides substantially with the rising of the clock X, the time point of rising of the switch control signal b1[0] becomes unsettled, and as a result, operation of the PLL circuit may become unstable.

Therefore, an output signal from a timing detector circuit may be used in place of the clock X, to control the time points of rising of the switch control signals b1[1] to b1[4], b2[1] to b2[4], b3[1] to b3[4].

Figure 28:
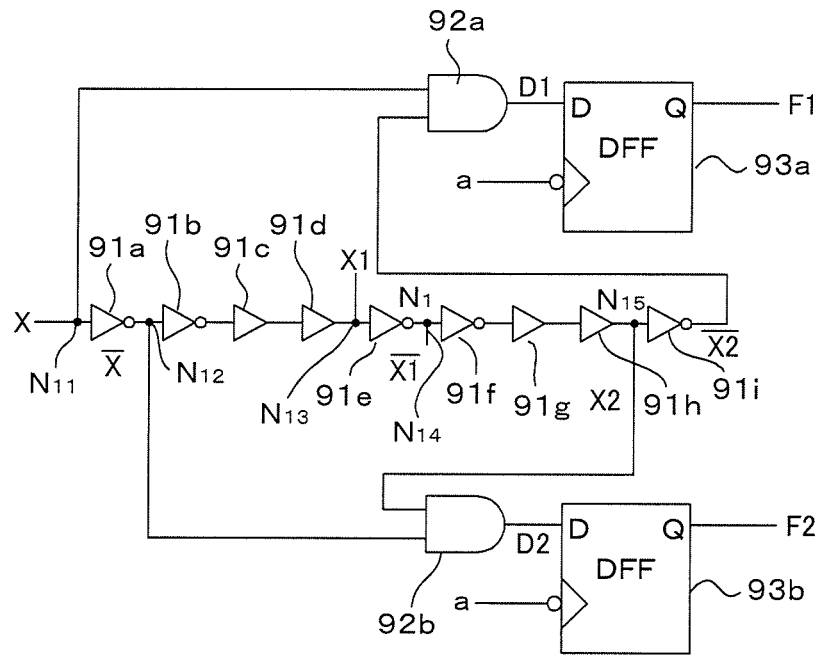
FIG. 28 is a diagram illustrating an example of a timing detector circuit.

FIG. 28 is a diagram illustrating an example of the timing detector circuit.

As illustrated in FIG. 28, the timing detector circuit includes inverters 91a, 91b, 91e, 91f, 91i, buffers 91c, 91d, 91g, 91h, D-type flip-flops 93a, 93b, and AND circuits 92a, 92b.

The inverters 91a, 91b, 91e, 91f, 91i and the buffers 91c, 91d, 91g, 91h are connected in series in the following order: the inverter 91a, the inverter 91b, the buffer 91c, the buffer 91d, the inverter 91e, the inverter 91f, the buffer 91g, the buffer 91h, and the inverter 91i. Here, an input terminal of the inverter 91a is connected to a node $N_{11}$, and an output terminal of the inverter 91a and an input terminal of the inverter 91b are connected to a node $N_{12}$. Also, an output terminal of the buffer 91d and an input terminal of the inverter 91e are connected to a node $N_{13}$, and an output terminal of the inverter 91e and an input terminal of the inverter 91f are connected to a node $N_{14}$. Further, an output terminal of the buffer 91h and an input terminal of the inverter 91i are connected to a node $N_{15}$.

An inverted signal of the clock X is outputted at the node $N_{12}$, a signal X1 obtained by delaying the clock X is outputted at the node $N_{13}$, and an inverted signal of the signal X1 is outputted at the node $N_{14}$. Also, a signal X2 obtained by delaying the signal X1 is outputted at the node $N_{15}$, and an inverted signal of the signal X2 is outputted from the inverter 91i.

An input terminal of the AND circuit 92a is connected to the node $N_{11}$ and an output terminal of the inverter 91i. The D-type flip-flop 93a receives input of a signal D1 outputted from the AND circuit 92a and the switch control signal a (a1, a2 or a3), and outputs a signal F1.

An input terminal of the AND circuit 92b is connected to the node $N_{12}$ and the node $N_{15}$. The D-type flip-flop 93b receives input of a signal D2 outputted from the AND circuit 92b and the switch control signal a, and outputs a signal F2.

Figure 29:
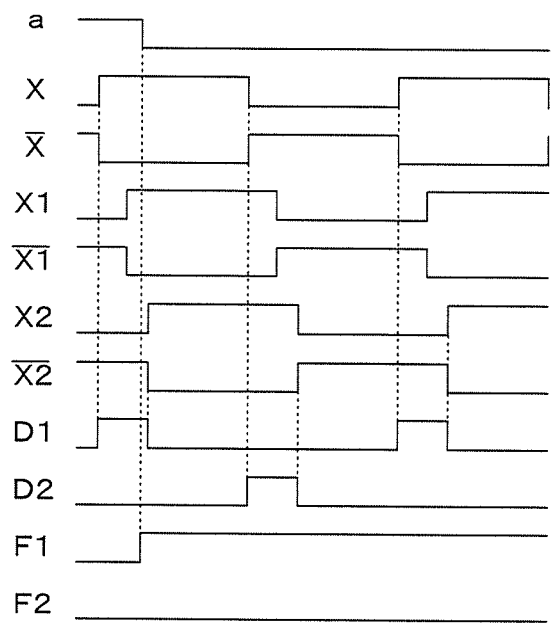
FIG. 29 is a timing chart illustrating operation of the timing detector circuit under phase-locked conditions.

FIG. 29 is a timing chart illustrating operation of the timing detector circuit under phase-locked conditions.

In Modification, when the signal F1 is "LOW," the signal X1 is used in place of the output clock X, to control the time points of rising of the switch control signals b1[0] to b1[4], b2[0] to b2[4], b3[0] to b3[4]. Also, when the signal F1 is "HIGH," the inverted signal of the signal X1 is used in place of the clock X, to control the time points of rising of the switch control signals b1[0] to b1[4], b2[0] to b2[4], b3[0] to b3[4].

In FIG. 29, the signal F1 is illustrated by example as being detected "HIGH." In this case, the inverted signal of the signal X1 is used in place of the clock X, to adjust the time points of rising of the switch control signals b1[0] to b1[4], b2[0] to b2[4], b3[0] to b3[4].

The time point of falling of the switch control signal a (a1, a2, a3) has an sufficient time difference from the time point of falling of the inverted signal of the signal X1, and thus, the switch control signals b1[0] to b1[4], b2[0] to b2[4], b3[0] to b3[4] may be stably outputted at the predetermined time points.

Fourth Embodiment

The feedback frequency division factor N of the PLL circuit is often variable. With reference to a fourth embodiment, therefore, description will be given with regard to a PLL circuit in which the feedback frequency division factor is variable.

Figure 30:
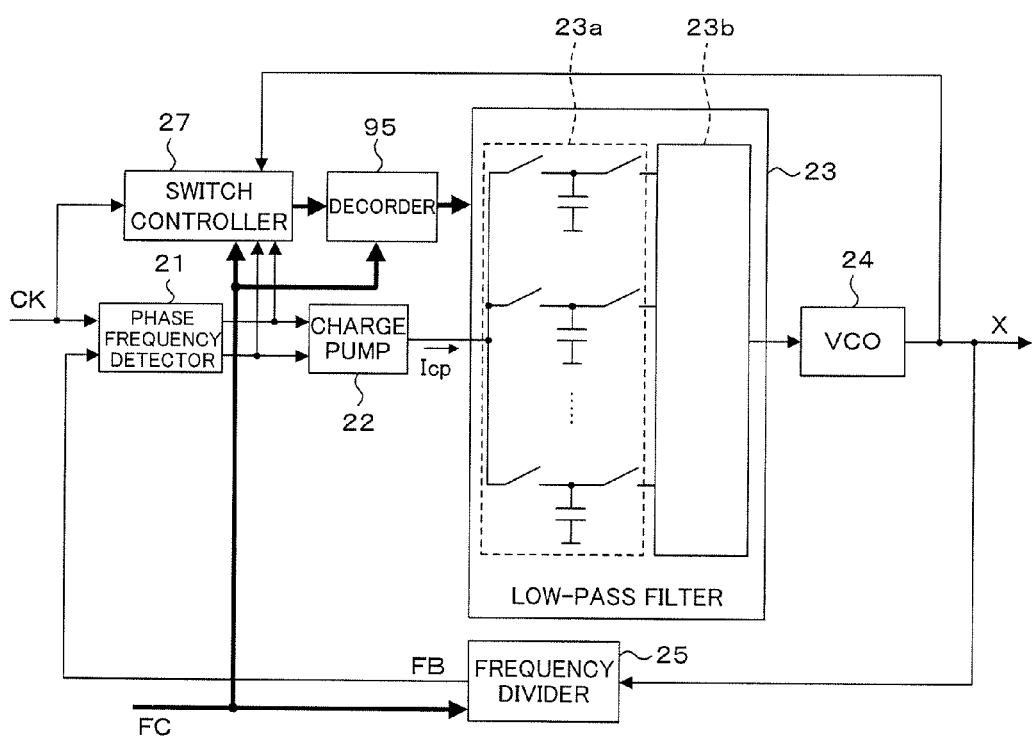
FIG. 30 is a diagram illustrating a PLL circuit according to a fourth embodiment.

FIG. 30 is a diagram illustrating a PLL circuit according to the fourth embodiment. In FIG. 30, the same parts as those in FIGS. 4 and 5 are designated by the same reference characters, and detailed description of the same parts will be omitted.

The PLL circuit according to the fourth embodiment includes the phase frequency detector 21, the charge pump 22, the low-pass filter 23, the VCO 24, the frequency divider 25, the switch controller 27, and a decoder 95. The frequency division factor of the frequency divider 25 is variable by a frequency division factor setting signal FC fed from an external device.

The switch controller 27 is configured as illustrated for example in FIGS. 20 to 22, and receives input of the input clock CK, the clock X outputted from the VCO 24, the Up signal UP and the Down signal DN outputted from the phase frequency detector 21, the frequency division factor setting signal FC, and the like. Then, the switch controller 27 outputs the switch control signals a1, a2, a3 and the switch control signals b1[0] to b1[3], b2[0] to b2[3], b3[0] to b3[3] at the predetermined time points, based on the received input signals.

The decoder 95 feeds the switch control signals a1, a2, a3 and the switch control signals b1[0] to b1[3], b2[0] to b2[3], b3[0] to b3[3] outputted from the switch controller 27, to the low-pass filter 23, at the time points according to the frequency division factor setting signal FC.

The low-pass filter 23 includes the preceding stage circuit portion 23a and the succeeding stage circuit portion 23b, generates the control voltage Vctrl according to the charge pump current supplied from the charge pump 22, and feeds the control voltage Vctrl to the VCO 24. The preceding stage circuit portion 23a is provided with m sets of charge storage circuits. Each of the charge storage circuits includes a switch 96[n] (where n is any integer between 1 and m) and a switch 98[n] connected in series, and a capacitor C[n] connected between a node between the switches 96[n], 98[n] and ground.

Incidentally, the time constant adjustment unit 23c as illustrated in FIG. 18 may be provided between the preceding stage circuit portion 23a and the succeeding stage circuit portion 23b.

Figure 31:
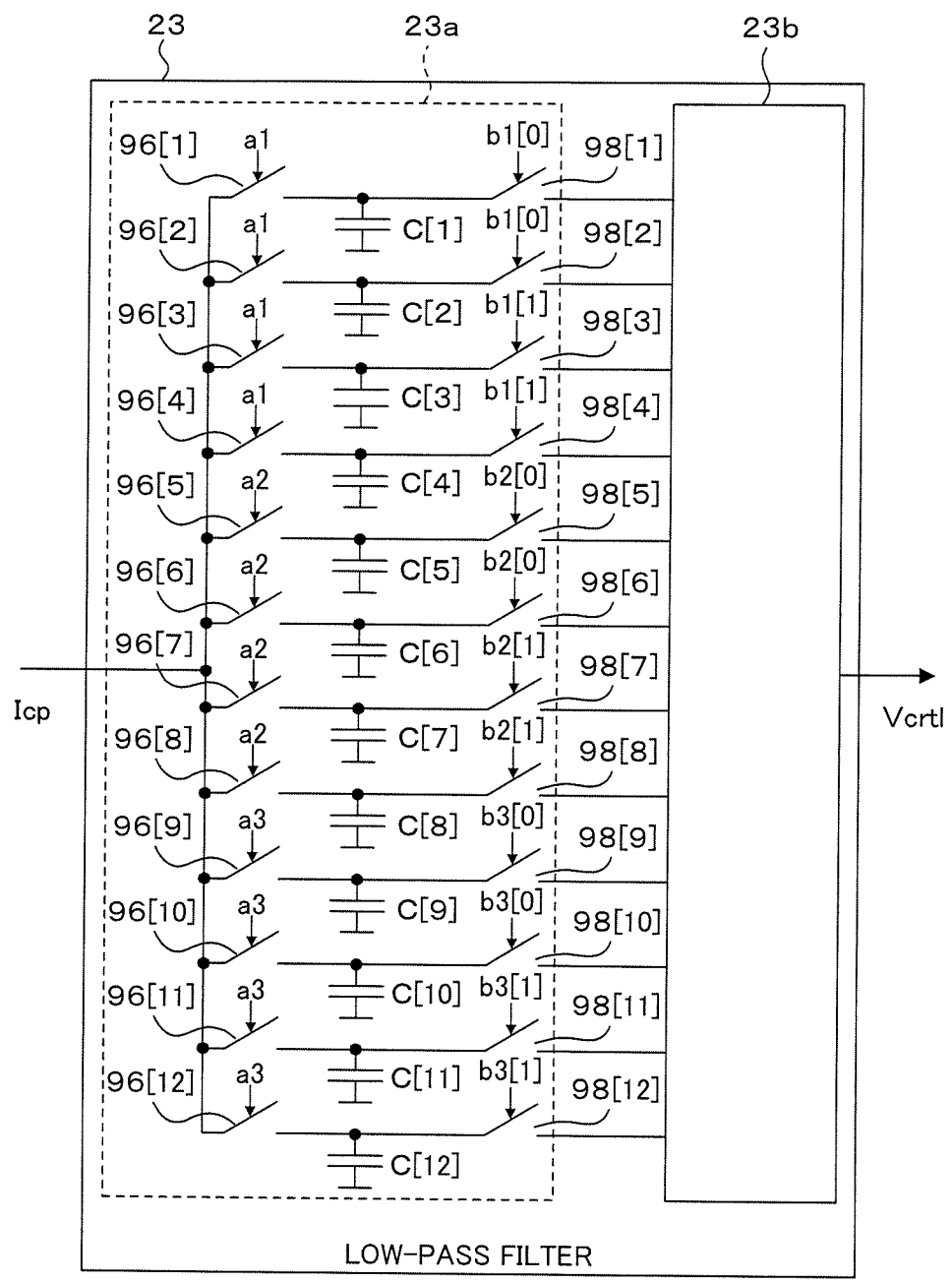
FIG. 31 is a diagram illustrating operation under conditions where a frequency division factor N of a frequency divider is set equal to 2 (N=2), in the fourth embodiment.
Figure 32:
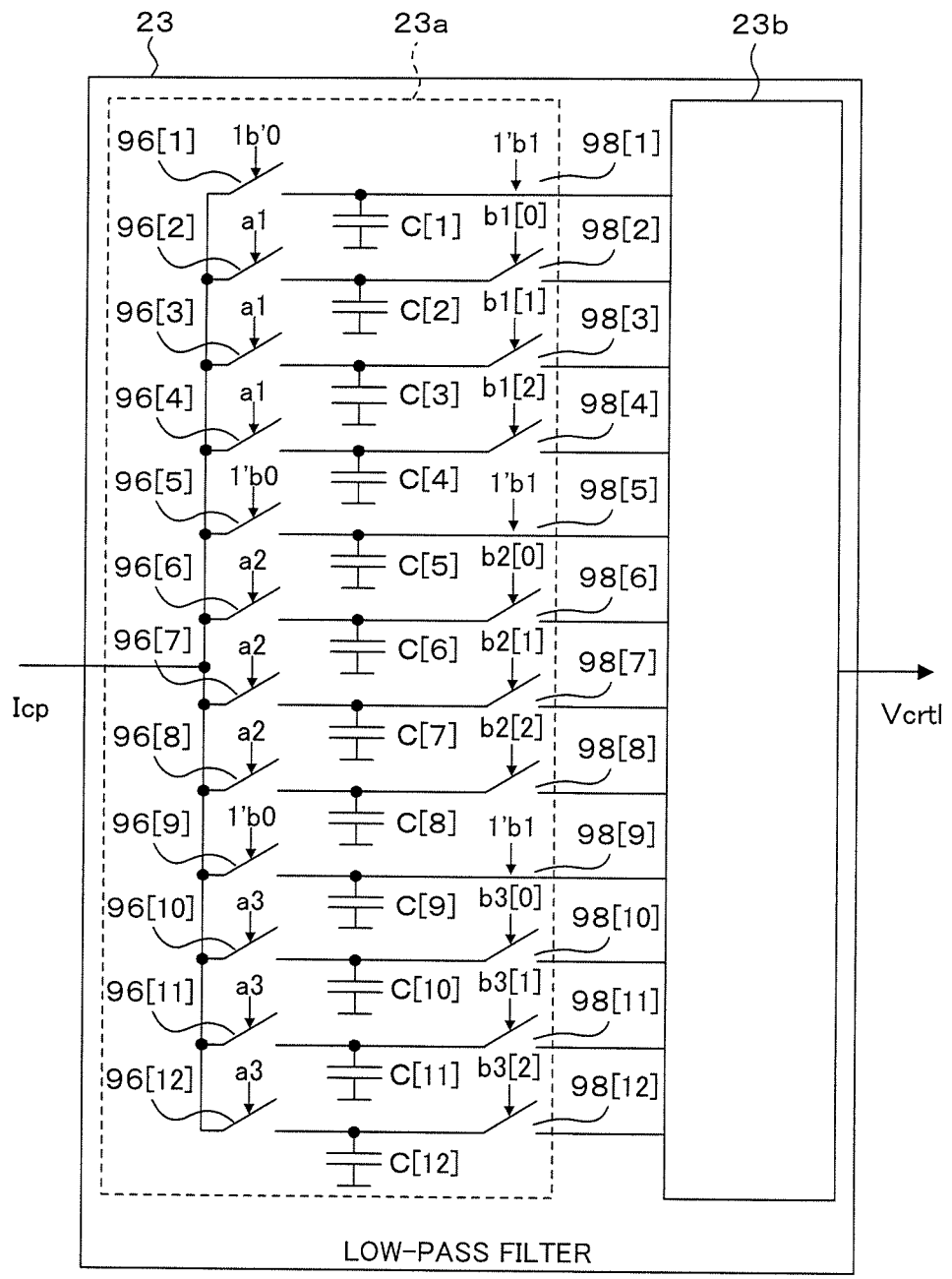
FIG. 32 is a diagram illustrating operation under conditions where the frequency division factor N of the frequency divider is set equal to 3 (N=3), in the fourth embodiment.
Figure 33:
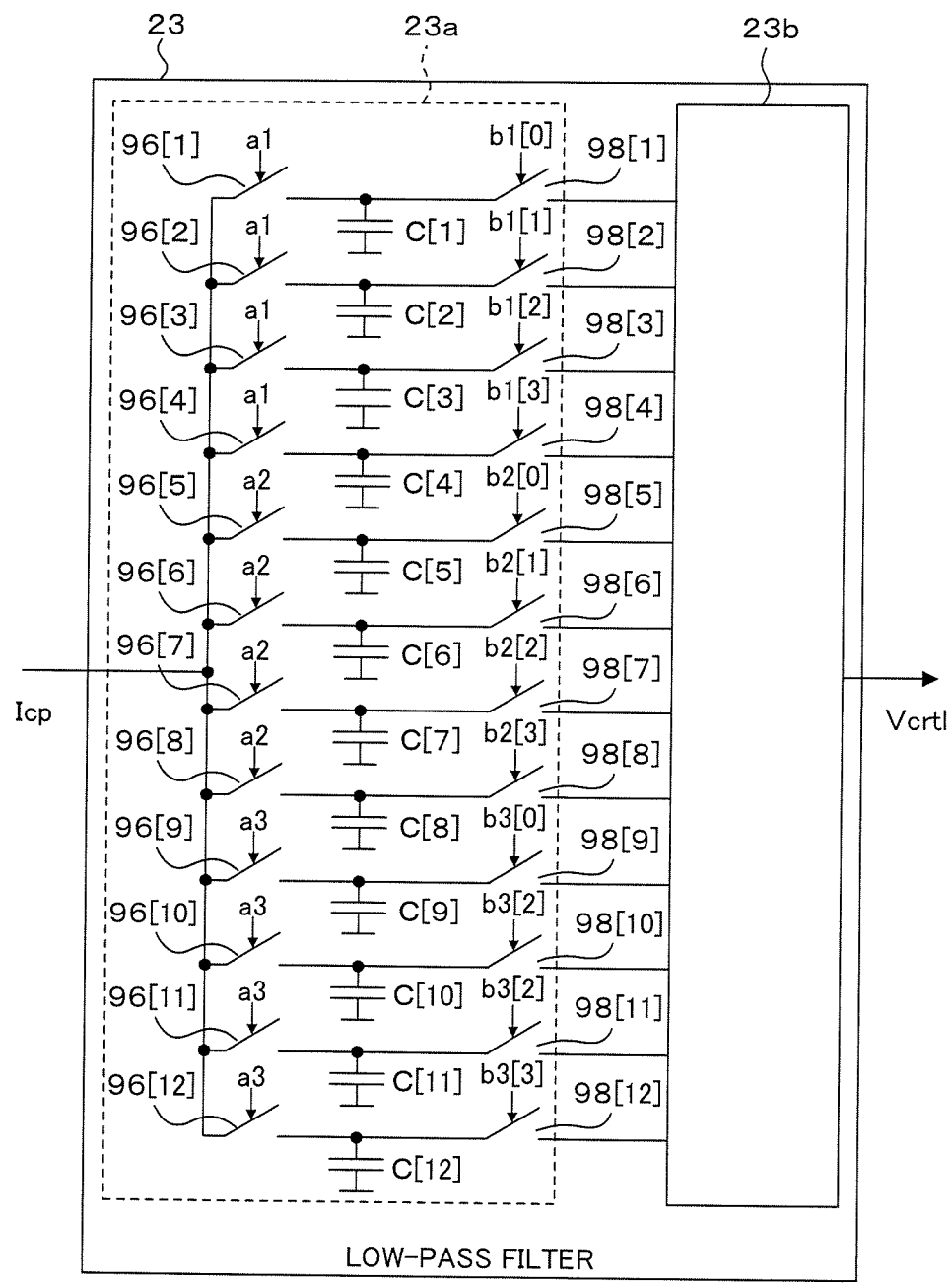
FIG. 33 is a diagram illustrating operation under conditions where the frequency division factor N of the frequency divider is set equal to 4 (N=4), in the fourth embodiment.

FIG. 31 is a diagram illustrating operation under conditions where the frequency division factor N of the frequency divider 25 is set equal to 2 (N=2), FIG. 32 is a diagram illustrating operation under conditions where the frequency division factor N of the frequency divider 25 is set equal to 3 (N=3), and FIG. 33 is a diagram illustrating operation under conditions where the frequency division factor N of the frequency divider 25 is set equal to 4 (N=4). Here, the number m of charge storage circuits is set equal to 12 for convenience of explanation.

As illustrated in FIG. 31, when the frequency division factor is set equal to 2, the switches 96[1] to 96[4] are supplied with the switch control signal a1, the switches 96[5] to 96[8] are supplied with the switch control signal a2, and the switches 96[9] to 96[12] are supplied with the switch control signal a3.

Also, the switches 98[1], 98[2] are supplied with the switch control signal b1[0], the switches 98[3], 98[4] are supplied with the switch control signal b1[1], the switches 98[5], 98[6] are supplied with the switch control signal b2[0], the switches 98[7], 98[8] are supplied with the switch control signal b2[1], the switches 98[9], 98[10] are supplied with the switch control signal b3[0], and the switches 98[11], 98[12] are supplied with the switch control signal b3[1].

Then, when the switch control signal a1 is "HIGH," electric charges according to the charge pump current Icp are stored in the capacitors C[1] to C[4]. After that, by the switch control signals b1[0], b1[1], the electric charges stored in the capacitors C[1] to C[4] are divided into two portions, which are then transferred one by one to the succeeding stage circuit portion 23b.

Likewise, when the switch control signal a2 is "HIGH," electric charges according to the charge pump current Icp are stored in the capacitors C[5] to C[8]. After that, by the switch control signals b2[0], b2[1], the electric charges stored in the capacitors C[5] to C[8] are divided into two portions, which are then transferred one by one to the succeeding stage circuit portion 23b. Also, when the switch control signal a3 is "HIGH," electric charges according to the charge pump current Icp are stored in the capacitors C[9] to C[12]. After that, by the switch control signals b3[0], b3[1], the electric charges stored in the capacitors C[9] to C[12] are divided into two portions, which are then transferred one by one to the succeeding stage circuit portion 23b.

As illustrated in FIG. 32, when the frequency division factor is set equal to 3, the switches 96[2] to 96[4] are supplied with the switch control signal a1, the switches 96[6] to 96[8] are supplied with the switch control signal a2, and the switches 96[10] to 96[12] are supplied with the switch control signal a3. Also, the switches 96[1], 96[5], 96[9] are supplied with a signal 1'b0 ("LOW"), and the switches 96[1], 96[5], 96[9] are held in the off position at all times.

Also, the switch 98[1] is supplied with the signal 1'b1 ("HIGH"), the switch 98[2] is supplied with the switch control signal b1[0], the switch 98[3] is supplied with the switch control signal b1[1], and the switch 98[4] is supplied with the switch control signal b1[2]. Further, the switch 98[5] is supplied with the signal 1'b1 ("HIGH"), the switch 98[6] is supplied with the switch control signal b2[0], the switch 98[7] is supplied with the switch control signal b2[1], and the switch 98[8] is supplied with the switch control signal b2[2]. Still further, the switch 98[9] is supplied with the signal 1'b1 ("HIGH"), the switch 98[10] is supplied with the switch control signal b3[0], the switch 98[11] is supplied with the switch control signal b3[1], and the switch 98[12] is supplied with the switch control signal b3[2].

Then, when the switch control signal a1 is "HIGH," electric charges according to the charge pump current Icp are stored in the capacitors C[2] to C[4]. After that, by the switch control signals b1[0] to b1[2], the electric charges stored in the capacitors C[2] to C[4] are divided into three portions, which are then transferred one after another to the succeeding stage circuit portion 23b.

Likewise, when the switch control signal a2 is "HIGH," electric charges according to the charge pump current Icp are stored in the capacitors C[6] to C[8]. After that, by the switch control signals b2[0] to b2[2], the electric charges stored in the capacitors C[6] to C[8] are divided into three portions, which are then transferred one after another to the succeeding stage circuit portion 23b. Also, when the switch control signal a3 is "HIGH," electric charges according to the charge pump current Icp are stored in the capacitors C[10] to C[12]. After that, by the switch control signals b3[0] to b3[2], the electric charges stored in the capacitors C[10] to C[12] are divided into three portions, which are then transferred one after another to the succeeding stage circuit portion 23b.

As illustrated in FIG. 33, when the frequency division factor is set equal to 4, the switches 96[1] to 96[4] are supplied with the switch control signal a1, the switches 96[5] to 96[8] are supplied with the switch control signal a2, and the switches 96[9] to 96[12] are supplied with the switch control signal a3.

Also, the switch 98[1] is supplied with the switch control signal b1[0], the switch 98[2] is supplied with the switch control signal b1[1], the switch 98[3] is supplied with the switch control signal b1[2], and the switch 98[4] is supplied with the switch control signal b1[3]. Further, the switch 98[5] is supplied with the switch control signal b2[0], the switch 98[6] is supplied with the switch control signal b2[1], the switch 98[7] is supplied with the switch control signal b2[2], and the switch 98[8] is supplied with the switch control signal b2[3]. Still further, the switch 98[9] is supplied with the switch control signal b3[0], the switch 98[10] is supplied with the switch control signal b3[1], the switch 98[11] is supplied with the switch control signal b3[2], and the switch 98[12] is supplied with the switch control signal b3[3].

Then, when the switch control signal a1 is "HIGH," electric charges according to the charge pump current Icp are stored in the capacitors C[1] to C[4]. After that, by the switch control signals b1[0] to b1[3], the electric charges stored in the capacitors C[1] to C[4] are divided into four portions, which are then transferred one after another to the succeeding stage circuit portion 23b.

Likewise, when the switch control signal a2 is "HIGH," electric charges according to the charge pump current Icp are stored in the capacitors C[5] to C[8]. After that, by the switch control signals b2[0] to b2[3], the electric charges stored in the capacitors C[5] to C[8] are divided into four portions, which are then transferred one after another to the succeeding stage circuit portion 23b. Also, when the switch control signal a3 is "HIGH," electric charges according to the charge pump current Icp are stored in the capacitors C[9] to C[12]. After that, by the switch control signals b3[0] to b3[3], the electric charges stored in the capacitors C[9] to C[12] are divided into four portions, which are then transferred one after another to the succeeding stage circuit portion 23b.

Thus, the decoder 95 may be provided for adaptation to the PLL circuit in which the frequency division factor of the frequency divider 25 is variable.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A PLL circuit comprising:
   a voltage controlled oscillator configured to output a signal of frequency according to a control voltage;
   a frequency divider configured to perform frequency division on the output signal from the voltage controlled oscillator;
   a phase frequency detector configured to compare phases of an input clock and an output signal from the frequency divider;
   a charge pump configured to output a current according to an output signal from the phase frequency detector; and
   a low-pass filter configured to generate the control voltage according to the output current from the charge pump,
   wherein the low-pass filter includes a preceding stage circuit portion configured to store electric charges according to the output current from the charge pump, and a succeeding stage circuit portion configured to generate the control voltage by receiving the electric charges stored in and transferred from the preceding stage circuit portion, and
   the preceding stage circuit portion includes a plurality of charge storage circuits each including a first capacitor, a first switch connected between the first capacitor and the charge pump and configured to be driven by a first switch control signal, and a second switch connected between the first capacitor and the succeeding stage circuit portion and configured to be driven by a second switch control signal, and the preceding stage circuit portion includes a common output node commonly coupled to the second switches of the plurality of charge storage circuits, and
   the succeeding stage circuit portion includes a second capacitor coupled to the common output node.

2. The PLL circuit according to claim 1, further comprising:
   a switch controller configured to generate the first switch control signal and the second switch control signal,
   wherein the switch controller is configured to feed the first switch control signal to the first switches of the plurality of charge storage circuits at the same time point, and to feed the second switch control signal to the second switches at time points shifted from each other.

3. The PLL circuit according to claim 1, wherein
   m and N have a relationship of m=N−1, where m denotes the number of the charge storage circuits and N denotes a frequency division factor of the frequency divider.

4. The PLL circuit according to claim 1, wherein
   the first switch and the second switch are configured to be turned on or off even under non-phase-locked conditions.

5. The PLL circuit according to claim 1, wherein
   the switch controller is configured to output the first switch control signal and the second switch control signal at time points in synchronization with the output signal from the voltage controlled oscillator or a signal generated from the output signal.

6. The PLL circuit according to claim 1, further comprising a time constant adjustment unit provided between the preceding stage circuit portion and the succeeding stage circuit portion of the low-pass filter, the time constant adjustment unit including a resistor and a third switch connected in parallel with the resistor and configured to be driven by a third switch control signal.

7. The PLL circuit according to claim 1, wherein
   the plurality of charge storage circuits of the preceding stage circuit portion are divided into a plurality of groups, and the first switch control signal and the second switch control signal are fed to each of the plurality of groups in turn in a certain order.

8. The PLL circuit according to claim 7, wherein
   each of the plurality of groups includes a first number of the charge storage circuits, the first number being equal to a multiple or divisor of the frequency division factor of the frequency divider.

9. The PLL circuit according to claim 1, wherein
   the succeeding stage circuit portion of the low-pass filter includes an operational amplifier, and a third capacitor connected between an input terminal and an output terminal of the operational amplifier.

10. The PLL circuit according to claim 1, wherein
    under phase-locked conditions, the switch controller turns off the second switch when turning on the first switch, and turns off the first switch when turning on the second switch.

11. The PLL circuit according to claim 1, wherein
    under phase-locked conditions, timings of output of the first switch control signal and the second switch control signal are determined by a signal obtained by detecting a time point of rising or falling of the output signal from the voltage controlled oscillator and delaying or inverting the output signal from the voltage controlled oscillator.

12. The PLL circuit according to claim 1, wherein
    the frequency division factor of the frequency divider is variable.

13. The PLL circuit according to claim 1, wherein
    the succeeding stage circuit portion includes a resistor coupled to the common output node in series with respect to the second capacitor.

* * * * *

UNITED STATES PATENT AND TRADEMARK OFFICE
CERTIFICATE OF CORRECTION

PATENT NO. : 8,704,564 B2
APPLICATION NO. : 13/780936
DATED : April 22, 2014
INVENTOR(S) : Kazuki Hasegawa It is certified that error appears in the above-identified patent and that said Letters Patent is hereby corrected as shown below:

Title Page,

~~(71) Applicant: Fujitsu Semiconductor Limited, Kanagawa (JP)~~ should read as

(71) Applicant: Fujitsu Semiconductor Limited, Yokohama (JP)

Signed and Sealed this
Fifteenth Day of July, 2014

Michelle K. Lee
*Deputy Director of the United States Patent and Trademark Office*